United States Patent
Kang et al.

(10) Patent No.: US 11,921,151 B2
(45) Date of Patent: Mar. 5, 2024

(54) JIG FOR INSPECTION APPARATUS, INSPECTION APPARATUS, AND INSPECTION SET

(71) Applicant: KOH YOUNG TECHNOLOGY INC., Seoul (KR)

(72) Inventors: Myong Kang, Gunpo-si (KR); Kang Jo Hwang, Seoul (KR); Choung Min Jung, Siheung-si (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 139 days.

(21) Appl. No.: 17/425,497

(22) PCT Filed: Jan. 22, 2020

(86) PCT No.: PCT/KR2020/001073
§ 371 (c)(1),
(2) Date: Jul. 23, 2021

(87) PCT Pub. No.: WO2020/153741
PCT Pub. Date: Jul. 30, 2020

(65) Prior Publication Data
US 2022/0091179 A1    Mar. 24, 2022

(30) Foreign Application Priority Data
Jan. 24, 2019    (KR) ........................ 10-2019-0009391

(51) Int. Cl.
*G01R 31/28*    (2006.01)
*G01R 1/04*    (2006.01)
(Continued)

(52) U.S. Cl.
CPC ................. *G01R 31/2808* (2013.01)

(58) Field of Classification Search
CPC ............... G01R 31/28; G01R 31/2808; G01R 31/2867; G01R 31/2887; G01R 31/2893;
(Continued)

(56) References Cited

U.S. PATENT DOCUMENTS

| 6,362,877 B1 | 3/2002 | Kobayashi et al. |
| 2004/0016136 A1 | 1/2004 | Igarashi et al. |

(Continued)

FOREIGN PATENT DOCUMENTS

| CN | 1121368 | 4/1996 |
| CN | 1460834 | 12/2003 |

(Continued)

OTHER PUBLICATIONS

Extended European Search Report, corresponding to European Application No./ Patent No. 20744756.6, dated Feb. 18, 2022.
(Continued)

*Primary Examiner* — Neel D Shah
(74) *Attorney, Agent, or Firm* — KILE PARK REED & HOUTTEMAN PLLC

(57) ABSTRACT

An inspection apparatus according to one embodiment of the present disclosure is configured to inspect an inspection object seated on a jig, the jig capable of being introduced into and withdrawn from the inspection apparatus. The inspection apparatus includes: a mover configured to move the jig; and a clamping driver configured to contact and press the jig, the clamping driver including a pressing portion configured to be movable in a clamping direction and an unclamping direction opposite to the clamping direction.

16 Claims, 19 Drawing Sheets

(51) Int. Cl.
  *G01R 1/067* (2006.01)
  *G01R 1/073* (2006.01)
  *G01R 31/304* (2006.01)

(58) Field of Classification Search
  CPC .... G01R 31/2813; G01R 31/304; G01R 1/02; G01R 1/04; G01R 1/067; G01R 1/073
  See application file for complete search history.

(56) References Cited

U.S. PATENT DOCUMENTS

| | | |
|---|---|---|
| 2005/0129469 A1 | 6/2005 | Ikehata et al. |
| 2006/0290369 A1 | 12/2006 | Yamashita et al. |
| 2008/0265479 A1 | 10/2008 | Chen et al. |
| 2010/0201386 A1 | 8/2010 | Roelvink |
| 2010/0210386 A1* | 8/2010 | Long, Jr. ............... F16D 43/206 474/148 |
| 2012/0192616 A1* | 8/2012 | Wang .................... G01N 19/02 73/9 |
| 2013/0048466 A1 | 2/2013 | Tsunoi |
| 2013/0113494 A1 | 5/2013 | Nishihara et al. |
| 2015/0086303 A1 | 3/2015 | Nakagawa et al. |
| 2016/0163576 A1 | 6/2016 | Nakagawa et al. |
| 2016/0278217 A1 | 9/2016 | Tanaka et al. |
| 2017/0106391 A1 | 4/2017 | Han |
| 2018/0148282 A1 | 5/2018 | Ikeda |
| 2018/0297784 A1 | 10/2018 | Park et al. |
| 2018/0368296 A1 | 12/2018 | Fujishiro et al. |
| 2019/0135562 A1 | 5/2019 | Ikeda |
| 2020/0115175 A1 | 4/2020 | Ikeda |

FOREIGN PATENT DOCUMENTS

| | | |
|---|---|---|
| CN | 1629061 | 6/2005 |
| CN | 101144920 | 3/2008 |
| CN | 201672910 | 12/2010 |
| CN | 202066796 | 12/2011 |
| CN | 102963725 | 3/2013 |
| CN | 103038932 | 4/2013 |
| CN | 104459425 | 3/2015 |
| CN | 104505485 | 4/2015 |
| CN | 105752635 | 7/2016 |
| CN | 205384112 | 7/2016 |
| CN | 106443041 | 2/2017 |
| CN | 107738919 | 2/2018 |
| CN | 107926150 | 4/2018 |
| CN | 207293648 | 5/2018 |
| CN | 207335610 | 5/2018 |
| CN | 108663011 | 10/2018 |
| CN | 108698767 | 10/2018 |
| CN | 208091375 | 11/2018 |
| CN | 109202778 | 1/2019 |
| JP | 5-107296 | 4/1993 |
| JP | 10-221058 | 8/1998 |
| JP | 2000-338164 | 12/2000 |
| JP | 2001-44693 | 2/2001 |
| JP | 2004-186681 | 7/2004 |
| JP | 3691146 | 6/2005 |
| JP | 2006-138808 | 6/2006 |
| JP | 2007-311497 | 11/2007 |
| JP | 2011-60981 | 3/2011 |
| JP | 2013-51333 | 3/2013 |
| JP | 2017-207329 | 11/2017 |
| JP | 2018-159695 | 10/2018 |
| JP | 2018-531200 | 10/2018 |
| KR | 10-0582695 | 5/2006 |
| KR | 20-0420972 | 7/2006 |
| KR | 10-2009-008736 | 8/2009 |
| KR | 10-2013-0031789 | 3/2013 |
| KR | 10-2014-0097648 | 8/2014 |
| KR | 10-1557783 | 10/2015 |
| KR | 10-1614706 | 4/2016 |
| KR | 10-2016-0048549 | 5/2016 |
| KR | 10-1682012 | 12/2016 |
| KR | 10-2017-0050580 | 5/2017 |
| KR | 10-1743479 | 6/2017 |

OTHER PUBLICATIONS

Extended European Search Report, corresponding to European Application No./ Patent No. 20744658.4, dated Feb. 18, 2022.
Japanese Office Action, with English translation, corresponding to Japanese Patent Application No. 2021-543257 dated Aug. 4, 2022.
Japanese Office Action, with English translation, corresponding to Japanese Patent Application No. 2021-543254 dated Aug. 23, 2022.
International Search Report with English translation for International Application No. PCT/KR2020/001074, dated May 26, 2020.
International Search Report with English translation for International Application No. PCT/KR2020/001073, dated May 4, 2020.
Written Opinion with English translation for International Application No. PCT/KR2020/001073, dated May 4, 2020.
Written Opinion with English translation for International Application No. PCT/KR2020/001074, dated May 26, 2020.
Non-Final Office Action for U.S. Appl. No. 17/425,511, dated Apr. 20, 2023.
Chinese Office Action with English translation for Chinese Patent Application or Patent No. 202080010629.8, dated Jan. 20, 2023.
Chinese Office Action with English translation for Chinese Patent Application or Patent No. 202080010637.2, dated Jan. 20, 2023.
Korean Office Action with English translation for Korean Patent Application No. 10-2021-7023517, dated Jun. 20, 2023.
Korean Office Action with English translation for Korean Patent Application No. 10-2021-7023518, dated Jun. 21, 2023.
Korean Office Action with English translation for Korean Patent Application No. 10-2021-7023518, dated Jul. 19, 2023.

* cited by examiner

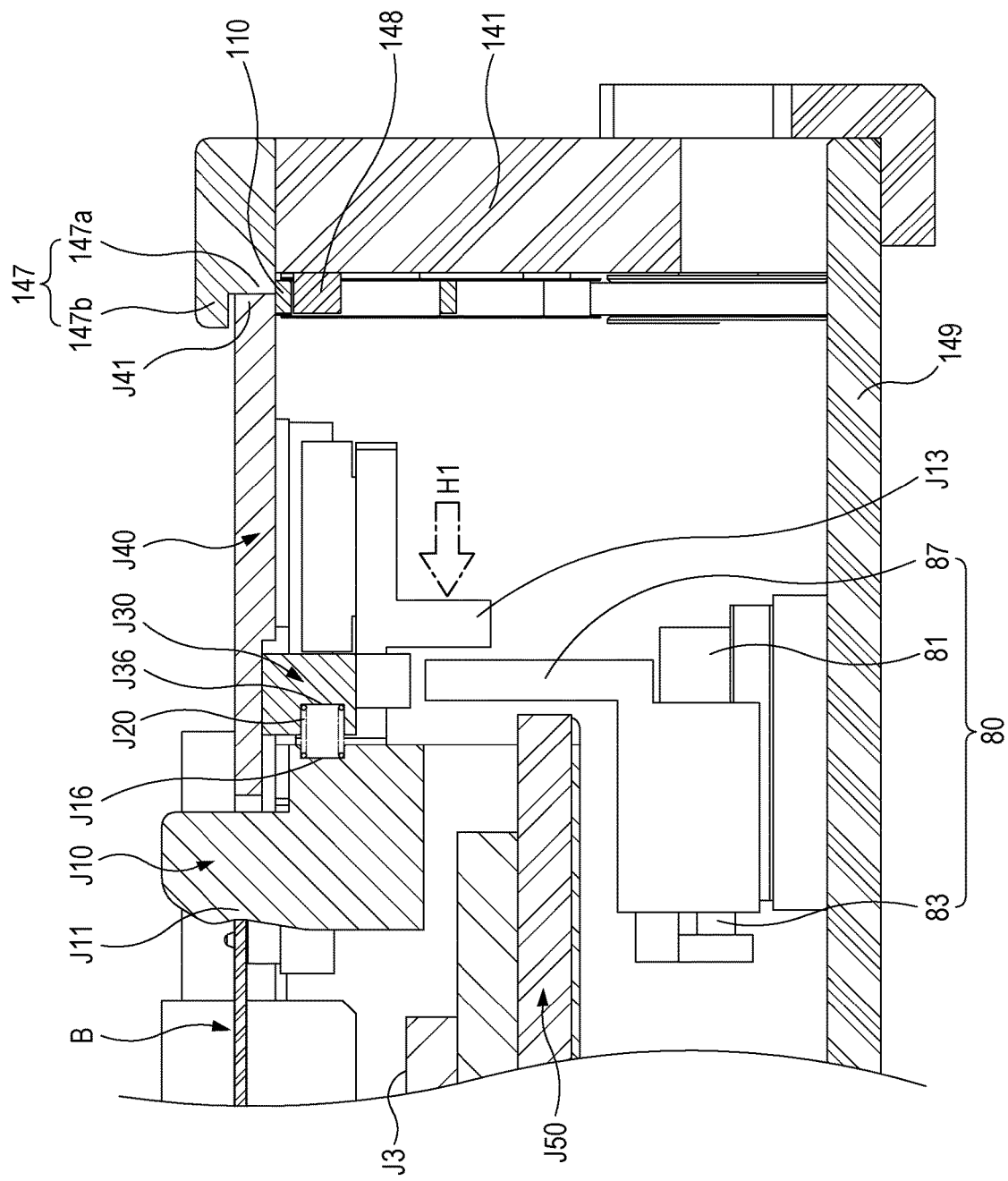

JIG FOR INSPECTION APPARATUS, INSPECTION APPARATUS, AND INSPECTION SET

CROSS REFERENCE TO RELATED APPLICATIONS

The application is a national entry of International Application No. PCT/KR2020/001073, filed on Jan. 22, 2020, which claims under 35 U.S.C. § 119(a) and 365(b) priority to and benefits of Korean Patent Application No. 10-2019-0009391, filed on Jan. 24, 2019 in the Korean Intellectual Property Office, the entire contents of which are incorporated herein by reference.

TECHNICAL FIELD

The present disclosure relates to a jig for an inspection apparatus, an inspection apparatus, an inspection set, and an object inspection method using same.

BACKGROUND

In the case of manufacturing and distributing various products as they are or assembling them with other products, the process of performing an inspection on the manufactured state or the assembled state of the products (objects) is an essential process in order to increase the reliability of the products. Conventional product inspections have been visually performed. In recent years, a technique for improving inspection accuracy and increasing a work speed through the use of an inspection apparatus has been developed.

The type, shape and size of objects may be different. For example, a substrate such as a printed circuit board (PCB) or the like may be an object. A plurality of elements may be disposed on the substrate. A pin insertion apparatus may insert a plurality of pins into a plurality of holes formed on the substrate. Through the inserted pins, the substrate may be electrically connected to other components.

SUMMARY

Embodiments of the present disclosure provide an apparatus and method for efficiently inspecting an object.

In the related art, a jig is configured to move while being attached to a transfer system (e.g., a ball screw or a belt). Therefore, there is a problem in that considerable effort is required to separate the jig from an inspection apparatus when replacing the jig. Embodiments of the present disclosure solve the problem of the related art mentioned above.

In the related art, an object inspection apparatus in which an object is manually replaced has a problem in that a lot of effort is required for an operation of placing the object at a correct position and clamping the object. Embodiments of the present disclosure solve the problem of the related art mentioned above.

In the related art, an object inspection apparatus in which an object is manually replaced has a problem in that the safety for an operator is low. For example, since a jig is transferred by being mounted on a ball screw driven by a servomotor, there is a problem in that an operator may be fatally injured if the operator accidentally bumps his or her hand against the jig during the movement of the jig. Embodiments of the present disclosure solve the problem of the related art mentioned above.

One aspect of the present disclosure provides embodiments of an inspection set. An inspection set according to a representative embodiment includes: a jig configured to allow an inspection object to be seated thereon; and an inspection apparatus configured to inspect the inspection object, the jig capable of being introduced into and withdrawn from the inspection apparatus. The jig includes at least one damper configured to be capable of moving in a clamping direction in which the inspection object is clamped to the jig and to be capable of moving in an unclamping direction opposite to the clamping direction. The inspection apparatus includes a mover configured to move the jig and at least one clamping driver configured to contact and press the damper.

In some embodiments, the jig may include an elastic member configured to provide an elastic force to press the damper in the clamping direction. The clamping driver may include a pressing portion configured to press the damper in the unclamping direction.

In some embodiments, the elastic member may be configured to be elastically deformed as the pressing portion presses the damper in the unclamping direction. The pressing portion may be configured to be spaced apart from the damper as the pressing portion moves in the clamping direction.

In some embodiments, the clamping driver may include a pressing portion configured to press the damper in the unclamping direction. The damper may include a driving contact portion having a surface in the clamping direction capable of making contact with the pressing portion.

In some embodiments, the pressing portion and the driving contact portion may be configured to face each other in a state in which the jig is located at a predetermined position with respect to the inspection apparatus.

In some embodiments, the at least one damper may include a pair of dampers, and the at least one clamping driver may include a pair of clamping drivers corresponding to the pair of dampers.

In some embodiments, the jig may be configured to be introduced into and withdrawn from the inspection apparatus in a direction perpendicular to the clamping direction.

Another aspect of the present disclosure provides embodiments of an inspection apparatus. An inspection apparatus according to a representative embodiment is configured to inspect an inspection object seated on a jig, the jig capable of being introduced into and withdrawn from the inspection apparatus. The inspection apparatus includes: a mover configured to move the jig; and a clamping driver configured to contact and press the jig, the clamping driver including a pressing portion configured to be movable in a clamping direction and an unclamping direction opposite to the clamping direction.

In some embodiments, the mover may be configured to move the jig in a direction perpendicular to the clamping direction.

In some embodiments, the mover may be configured to move the jig in a front-rear direction in a state in which the jig is capable of slipping.

In some embodiments, the mover may include a transfer belt configured to support the jig and move the jig in a rear direction or in a front direction.

In some embodiments, the inspection apparatus may further include a stopper configured to be capable of making contact with a rear end of the jig when the jig is moved in a rear direction by the mover.

In some embodiments, the inspection apparatus may further include at least one sensor configured to detect the jig when the jig is located at a predetermined position.

In some embodiments, the inspection apparatus may further include: a pair of transports each having the mover and configured to support left and right end portions of the jig; a frame guide configured to guide movement of at least one of the transports in a left-right direction; and a driver configured to provide a driving force to move the at least one of transports in the left-right direction.

In some embodiments, the inspection apparatus may further include a sensor configured to detect whether the inspection object is placed.

In some embodiments, the inspection apparatus may be configured to inspect whether an insertion of a pin inserted into the inspection object is defective.

A further aspect of the present disclosure provides embodiments of a jig for an inspection apparatus. A jig for an inspection apparatus according to a representative embodiment is configured to allow an inspection object to be seated thereon, capable of being introduced into and withdrawn from the inspection apparatus for inspecting the inspection object. The jig includes: a damper configured to be movable in a clamping direction in which the inspection object is clamped and to be movable in an unclamping direction opposite to the clamping direction; and a clamping guide configured to guide movement of the damper. The damper includes an object contact portion configured to be capable of making contact with the inspection object, and a driving contact portion configured to be capable of making contact with the inspection apparatus to receive a driving force to move the damper.

In some embodiments, the jig may further include an elastic member configured to provide an elastic force to press the damper in the clamping direction.

In some embodiments, the jig may further include: a guide wall configured to be capable of making contact with a side surface of the inspection object; and a guide pin configured to be inserted into a groove or hole of the inspection object.

A still further aspect of the present disclosure provides embodiments of an object inspection method using the inspection set mentioned above. An object inspection method according to a representative embodiment includes: a clamping step of moving the damper in the clamping direction to clamp the inspection object seated on the jig to the jig; a first movement step of moving the jig by the mover; an inspection step of inspecting the inspection object to determine whether the inspection object is defective; a second movement step of moving the jig by the mover; and an unclamping step of moving the damper in the unclamping direction to unclamp the inspection object from the jig.

According to the embodiments of the present disclosure, it is possible to efficiently and accurately inspect an object.

According to the embodiments of the present disclosure, an operation of locating an object on a jig and an operation of clamping the object are performed at once. This makes it possible to complete an operation of loading the object in one step. Accordingly, it is possible to conveniently perform the operation of locating and clamping the object, and it is possible to conveniently replace the object.

According to the embodiments of the present disclosure, it is possible to conveniently inspect objects having different specifications with one apparatus.

According to the embodiments of the present disclosure, it is possible to conveniently use jigs having different specifications in one apparatus.

According to the embodiments of the present disclosure, a jig is transferred on a transfer belt (e.g., a conveyor belt). Therefore, even if an operator accidentally bumps into the jig, a slip is generated between the jig and the transfer belt, which makes it possible to prevent occurrence of a safety accident.

BRIEF DESCRIPTION OF THE DRAWINGS

FIGS. 12A and 12B are partial sectional views of the transport 100, the jig J and the object B taken along line S1-S1' in FIG. 8, wherein FIG. 12A shows a state in which the object B is clamped and FIG. 12B shows a state in which the object B is unclamped.

DETAILED DESCRIPTION

Figure 1:
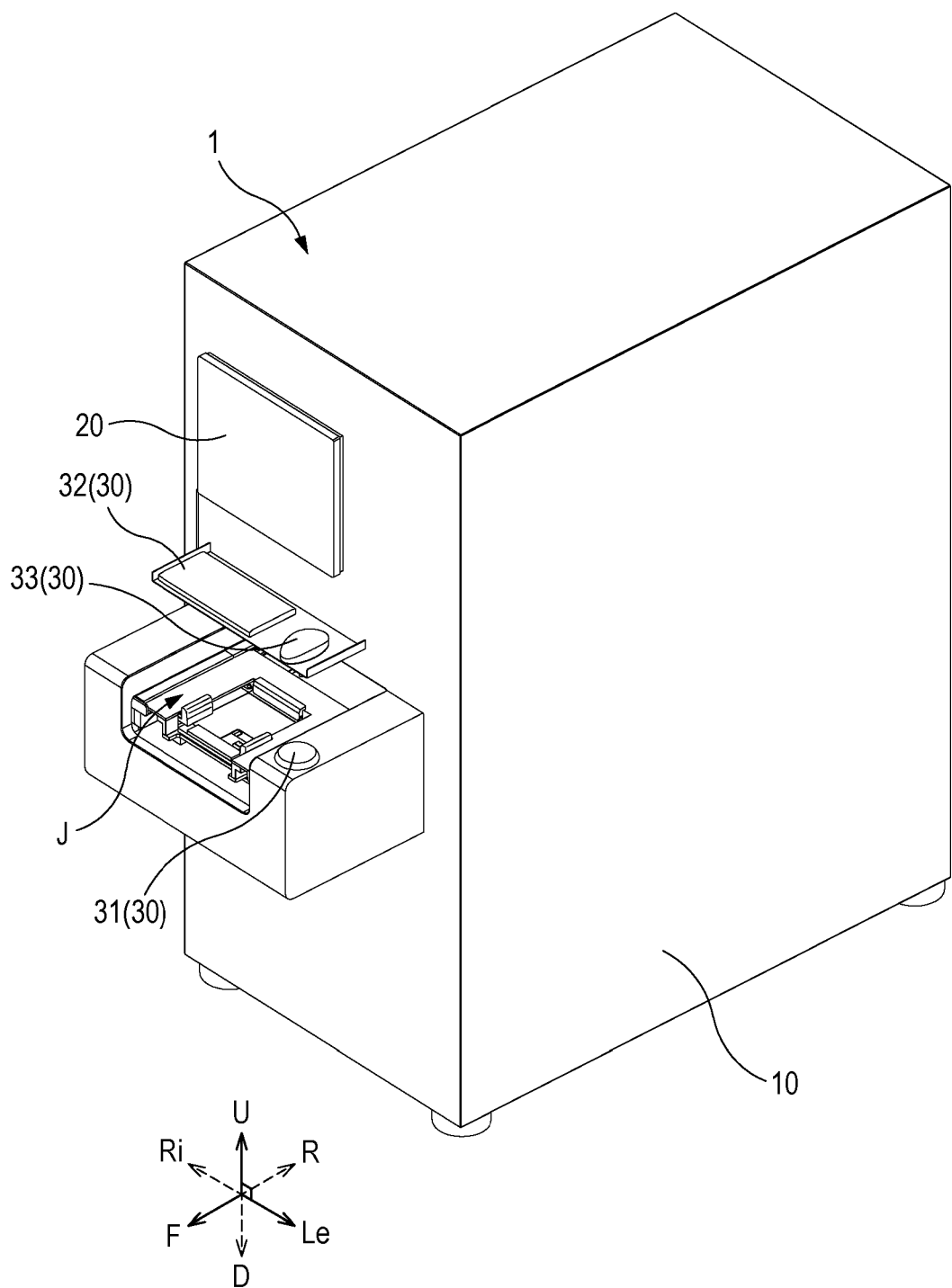
FIG. 1 is a perspective view of an inspection set 1, J for inspecting an object according to one embodiment of the present disclosure.

Embodiments of the present disclosure are illustrated for the purpose of explaining the technical idea of the present disclosure. The scope of the rights according to the present disclosure is not limited to the embodiments presented below or the detailed descriptions of such embodiments.

All technical and scientific terms used in the present disclosure have the meaning generally understood by those of ordinary skill in the art to which the present disclosure pertains, unless otherwise defined. All terms used in the present disclosure are chosen for the purpose of more clearly describing the present disclosure and are not chosen to limit the scope of rights according to the present disclosure.

As used in the present disclosure, expressions such as "comprising", "including", "having", and the like are to be understood as open-ended terms having the possibility of encompassing other embodiments, unless otherwise mentioned in the phrase or sentence containing such expressions.

The singular form described in the present disclosure may include a plural meaning, unless otherwise mentioned. This applies equally to the singular form recited in the claims.

The terms "first", "second", etc. used herein are used to identify a plurality of components from one another, and are not intended to limit the order or importance of the relevant components.

The expression "based on" used herein is used to describe one or more factors that influences a decision, an action of judgment or an operation described in a phrase or sentence including the relevant expression, and this expression does not exclude additional factor influencing the decision, the action of judgment or the operation.

In the present disclosure, where it is mentioned in the present disclosure that one element is "connected" to another element, it is to be understood that said one element may be directly connected to another element, or may be connected to another element via a new additional element.

The expressions indicating directions such as "front (F)", "rear (R)", "left (Le)", "right (Ri)", "up (U)", "down (D)" and the like used in the present disclosure, are defined as indicated in the drawings. The expressions for the respective directions are used to make explanation so that the present disclosure can be clearly understood. The directions may be defined differently depending on what is the reference.

Hereinafter, descriptions are made as to embodiments of the present disclosure with reference to the accompanying drawings. In the accompanying drawings, the same or corresponding elements are denoted by the same reference numerals. In the following descriptions of the embodiments, descriptions of the same or corresponding elements may be omitted. However, even if the descriptions of elements are omitted, it is not intended that such elements are not included in a certain embodiment.

Figure 2:
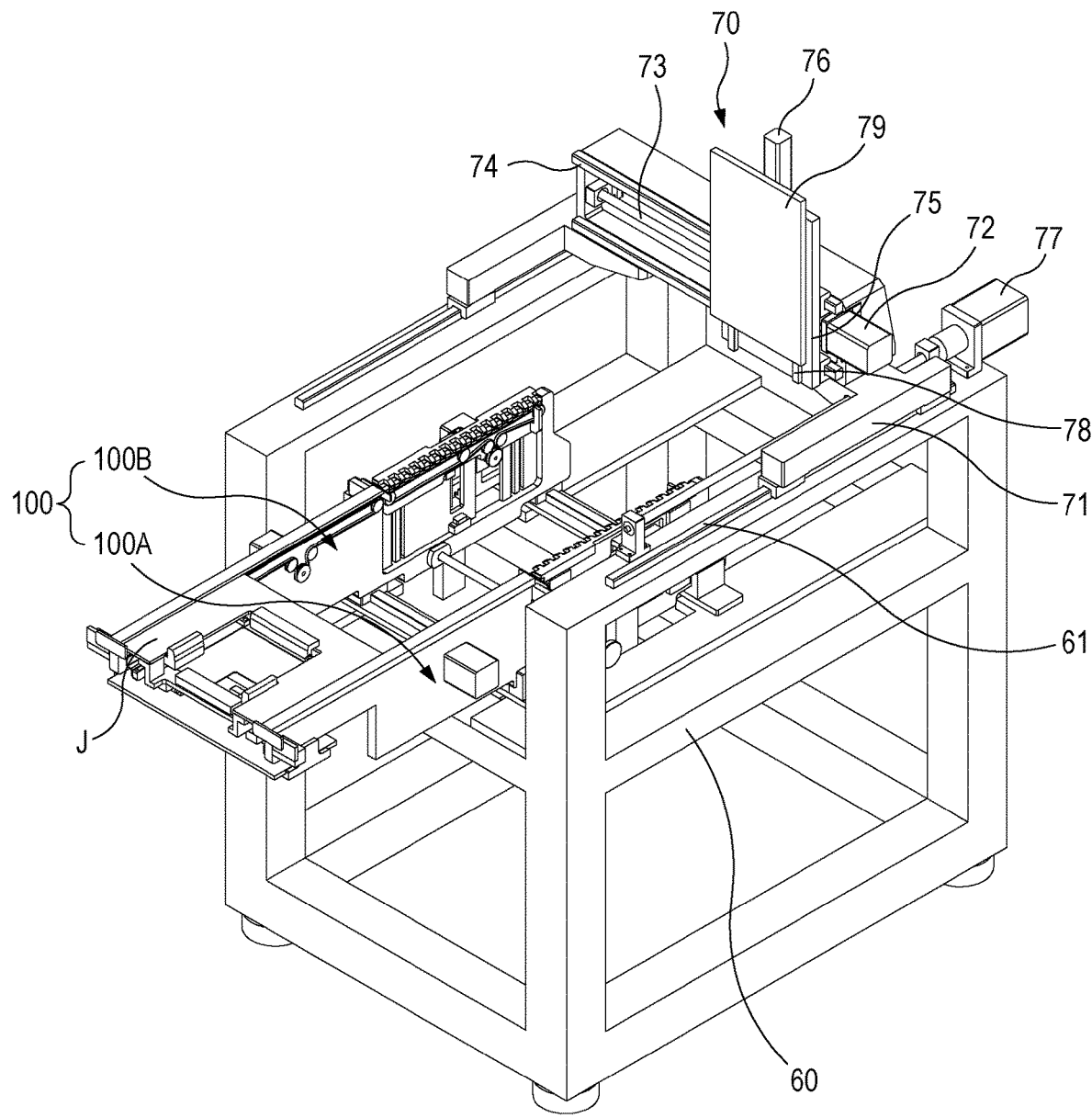
FIG. 2 is a perspective view showing a structure inside the case 10 shown in FIG. 1.

FIG. 1 is a perspective view of an inspection set 1, J for inspecting an object according to one embodiment of the present disclosure. FIG. 2 is a perspective view showing a structure inside the case 10 shown in FIG. 1. Referring to FIGS. 1 and 2, the object inspection set 1, J includes an object inspection apparatus 1 and a jig J. The inspection apparatus 1 is configured to inspect an object. The jig J is configured so that the object can be seated thereon. The inspection apparatus 1 inspects the object seated on the jig J.

In the present embodiment, the inspection apparatus 1 inspects whether an insertion of pins inserted into the object is defective. In this case, the object may be a substrate. For example, the failure may occur due to the characteristics of the pins inserted into the object, the setting error of a pin insertion apparatus, the mechanical clearance or defect of the pin insertion apparatus, the non-planarity of the object, and the like.

For example, the external pin insertion apparatus (not shown) may perform a process of inserting a plurality of pins into a substrate as an object, and the substrate (object) into which the pins are inserted may be transferred to the inspection apparatus 1. The inspection apparatus 1 may inspect the insertion state of each of the pins inserted into the substrate. The inspection apparatus 1 may irradiate pattern light to the substrate and may receive the pattern light reflected from each of the pins inserted into the substrate. The inspection apparatus 1 may measure a height, an insertion position, etc. of each of the pins through the use of the received pattern light, and inspect the insertion state of each of the pins through the use of the measured information. The inspection apparatus 1 may quickly and accurately inspect the insertion state of the pins inserted into the object by using the information measured through the pattern light. In another embodiment, the inspection apparatus 1 may inspect the surface of the object, inspect the position of an element seated on the object, or inspect the defect of a conductor printed on the object.

The object may be seated on and separated from the jig J. For example, the inspection set 1, J may be equipment for a manual line that requires the handling of an operator in an operation of loading and unloading the object, and the like. The object may be seated (loaded) on the jig J for inspection purposes, and may be separated (unloaded) from the jig J after the object is inspected. The object may be clamped to the jig J. The object may be unclamped from the jig J.

The jig J is configured to be introduced into and withdrawn from the inspection apparatus 1. When the type or specification of the object is changed, the jig J may be withdrawn from the inspection apparatus 1, and a different type of jig on which the changed object can be seated may be introduced into the inspection apparatus 1.

The inspection apparatus 1 moves the jig J. The inspection apparatus 1 includes a transport 100. The transport 100 includes a mover 110 configured to move the jig J. The jig J may be placed on the mover 110.

The inspection apparatus 1 has an inlet through which an uninspected object is introduced. The inspection apparatus 1 has an outlet through which an inspected object is discharged. In the present embodiment, the inlet and the outlet are formed at one position. In another embodiment, the inlet and the outlet may be formed at different positions. The jig J may be introduced into or withdrawn from the inspection apparatus 1 through the inlet and/or the outlet.

The inspection apparatus 1 may include a case 10 constituting a shell of the inspection apparatus 1, an output part 20 configured to output various types of information, and an input part 30 configured to input various types of information. The inspection apparatus 1 may include a communication circuit (not shown), a memory (not shown), a light source (not shown), an image sensor (not shown), and a control part (not shown). The respective components included in the inspection apparatus 1 may be electrically connected to each other to transmit and receive signals, data and the like.

The communication circuit may communicate with an external electronic device or an external server. The communication circuit may be connected to a network through wireless communication or wired communication to communicate with an external electronic device or an external server. As another example, the communication circuit may be connected to an external electronic device through wire to communicate.

The wireless communication may include, for example, cellular communication (e.g., LTE, LTE Advance (LTE-A), Code Division Multiple Access (CDMA), Wideband CDMA (WCDMA), Universal Mobile Telecommunications System (UMTS), Wireless Broadband (WiBro), and the like). Furthermore, the wireless communication may include short-range wireless communication (e.g., Wireless Fidelity (WiFi), Light Fidelity (LiFi), Bluetooth, Bluetooth Low Power (BLE), Zigbee, Near Field Communication (NFC), the like).

The output part 20 may output inspection result information for the object. When it is determined by the inspection result that the object is defective, the output part 20 may output information on the defective portion so that an operator can directly determine whether the object is defective. The information on the defective portion may include a 2D image, a 3D image, and/or various types of dimensional information of the defective portion.

The output part 20 may include a display. In one embodiment, the display may include a liquid crystal display (LCD), a light emitting diode (LED) display, an organic light emitting diode (OLED) display, or the like. For example, the display may present various contents (e.g., text, images, videos, icons, and/or symbols) to a user. The display may include a touch screen, and may receive, for example, a touch, gesture, proximity or hovering input using an electronic pen or a part of the user's body.

The input part 30 includes a start input part 31 configured to start an object inspection process of one cycle in a state in which the object is placed on the jig J. For example, the start input part 31 may include a button. Alternatively, the start input part 31 may be configured by any one of various known means such as a dial, a keyboard, a mouse, a touch screen and the like. The input part 30 may further include a keyboard 32 and a mouse 33.

The object inspection process of one cycle may include a process of loading an object, a process of moving and inspecting the object, and a process of unloading the object. The object inspection process of one cycle may further include a process of clamping the object to the jig J after the loading process. The object inspection process of one cycle may further include a process of unclamping the object from the jig J before the loading process. A detailed description thereof will be given later.

The control part may include a processor such as a computer or the like. For example, the processor may include a CPU, a microcontroller (MCU) and the like. The control part may operate the inspection apparatus 1 based on the information inputted through the input part 30. The control part may operate the inspection apparatus 1 based on the information acquired through various sensors. The control part may operate the inspection apparatus 1 based on the information acquired through image sensors to be described later. The control part may process a program related to the inspection of the object. The control part may control the output part 20 to output various types of processed information. The control part may execute control to operate various drivers such as a motor or a pneumatic cylinder to be described later.

In one embodiment, the light source may irradiate pattern light to the object. The light source may irradiate the pattern light to the entire object or to irradiate the pattern light to at least one target included in the object. For example, the at least one target may be a pin B2 inserted into the substrate (see FIG. 8). The light source may irradiate pattern light to the substrate into which a plurality of pins is inserted.

For example, the light source may include a grating (not shown), a grating transfer device (not shown), and a projection lens part (not shown). The grating may convert light irradiated from the light source into pattern light. The grating may be transferred by a grating transport such as a piezo actuator (PZT) or the like to generate a phase-shifted pattern light. The projection lens part may irradiate the pattern light generated by the grating to the object.

As another example, the light source may include Digital Light Processing (DLP) or Liquid Crystal On Silicon (LCoS). The DLP or the LCoS may convert the light irradiated from the light source into pattern light so as to be irradiated to the object.

The pattern light may be light having a pattern of a constant or specific period, which is irradiated to measure a three-dimensional shape of the object. The light source may irradiate pattern light in which the brightness of stripes has a sine wave pattern, on-off pattern light in which bright and dark parts are repeatedly displayed, or triangular wave pattern light in which a change in brightness is a triangular waveform. However, the present disclosure is not limited thereto. The light source may irradiate light having various types of patterns in which a change in brightness is repeated at a constant or specific period.

The light source may irradiate first wavelength light, second wavelength light and third wavelength light to the object. The light source may irradiate the first wavelength light, the second wavelength light and the third wavelength light to the entire object or at least one target included in the object.

In one embodiment, the light source may sequentially irradiate the first wavelength light, the second wavelength light and the third wavelength light, or may simultaneously irradiate at least two of the first wavelength light, the second wavelength light and the third wavelength light. For example, the first wavelength light may be red light, the second wavelength light may be green light, and the third wavelength light may be blue light. However, the present disclosure is not limited thereto. The first wavelength light, the second wavelength light and the third wavelength light may be light having different wavelengths.

Any one of a variety of known image sensors may be used as the image sensor. In one embodiment, the image sensor may receive the pattern light reflected from each of a plurality of pins inserted into the object. For example, the image sensor may receive pattern light reflected from each of the plurality of pins inserted into the object, and may generate an image (e.g., a three-dimensional image) for each of the plurality of pins by using the received pattern light.

Furthermore, the image sensor may receive the first wavelength light, the second wavelength light and the third wavelength light reflected from each of the plurality of pins inserted into the object. For example, when the first wavelength light, the second wavelength light and the third wavelength light are irradiated from the light source to the object, the image sensor may receive the first wavelength light, the second wavelength light and the third wavelength light reflected from each of the plurality of pins inserted into the object, and may generate an image (e.g., a two-dimensional image) of each of the plurality of pins by using the first wavelength light, the second wavelength light and the third wavelength light thus received. The image sensor may transmit the image of each of the plurality of pins to the control part. Alternatively, a plurality of image sensors may receive light from the same direction or different directions. For example, the image sensor may include a charge coupled device (CCD) camera, a complementary metal oxide semiconductor (CMOS) camera, and the like, but is not limited thereto.

The memory may store instructions or data related to at least one other component of the inspection apparatus 1. Furthermore, the memory may store software and/or programs. For example, the memory may include an internal memory or an external memory. The internal memory may include at least one of a volatile memory (e.g., a DRAM, an SRAM or an SDRAM), and a non-volatile memory (e.g., a flash memory, a hard drive or a solid state drive (SSD)). The external memory may be functionally or physically connected to the inspection apparatus 1 through various interfaces.

The memory may store instructions for causing the control part to operate. For example, the memory may store instructions that cause the control part to control other components of the inspection apparatus 1 and to interwork with an external electronic device or server. The control part may control other components of the inspection apparatus 1 based on the instructions stored in the memory, and may interwork with an external electronic device or server. In addition, instructions for causing the respective components to perform operations may be stored in the memory.

In one embodiment, the memory may store pin insertion reference information indicating a reference height and a reference position set for the plurality of pins inserted into the object. The reference height and the reference position set for each of the plurality of pins may be used to determine failure of insertion of each of the plurality of pins. Pin insertion reference information may be set according to object design information or user input.

In an embodiment, the memory may store information on a plurality of process parameters related to a pin insertion process of a pin insertion apparatus and information on values of the plurality of process parameters used in the pin insertion process performed on the object by the pin insertion apparatus. The information on the plurality of process parameters and the information on the values of the plurality of process parameters may be received from the pin insertion apparatus and stored in the memory, or may be generated by user input and stored in the memory. For example, the information on the plurality of process parameters may include information which indicates whether each of the plurality of process parameters can affect the pin insertion position, the pin bending, the inserted pin height, the pin shoulder coplanarity of the inserted pin, the pin insertion angle, and the like.

The control part may control at least one other component of the inspection apparatus 1 by driving an operating system or an application program, and may perform various data processing and calculations. For example, the control part may include a central processing unit or the like, and may be implemented as a system on chip (SoC).

Referring to FIG. 2, the inspection apparatus 1 includes a frame 60. The frame 60 supports a transport 100. The frame 60 supports a case 10. The frame 60 supports an image sensor moving device 70. The frame 60 supports various other components disposed directly on the frame 60 or disposed through other components.

The inspection apparatus 1 includes an image sensor moving device 70 that moves the image sensor. The image sensor moving device 70 may move the image sensor in a front-rear direction, a left-right direction, and/or an up-down direction.

The image sensor moving device 70 includes a first slider 71 configured to be slidable in the front-rear direction along a guide rail 61 fixed to the frame 60. The image sensor moving device 70 includes a driver 77 such as a motor or the like configured to provide a driving force for moving the first slider 71 in the front-rear direction. The image sensor moving device 70 includes a guide rail 74 fixed to the first slider 71 and extending in the left-right direction, and a second slider 75 configured to be slidable in the left-right direction along the guide rail 74. The image sensor moving device 70 includes a driver 72 such as a motor or the like configured to provide a driving force for moving the second slider 75 in the left-right direction. The image sensor moving device 70 includes a guide rail 78 fixed to the second slider 75 and extending in the up-down direction, and a third slider 79 configured to be slidable in the up-down direction along the guide rail 78. The image sensor moving device 70 includes a driver 76 such as a motor or the like configured to provide a driving force for moving the third slider 79 in the up-down direction. The image sensor may be fixed to the third slider 79. The image sensor may be arranged to sense light in a downward direction.

The image sensor moving device 70 may include a driving force transmitting part configured to transmit a driving force from each driver such as a motor or the like to the corresponding slider. The driving force transmitting part may include a lead screw or the like rotated by a motor. For example, when the lead screw 73 is rotated by the motor 72, the second slider 75 may move left and right along the lead screw 73. In the same way, a motor 77 and each lead screw rotated by a motor 76 may be provided. However, this is nothing more than an example in which the sliders 71, 75 and 79 are operated by the drivers. The present disclosure is not limited thereto.

The inspection apparatus 1 includes a transport 100 supported on the frame 60. The inspection apparatus 1 may include a pair of transports 100A and 100B. The pair of transports 100A and 100B may be configured such that the left and right end portions of the jig J are supported thereon. For example, the left and right end portions of the jig J are supported by the first transport 100A and the second transport 100B, respectively, so that the jig J can be moved.

Figure 3:
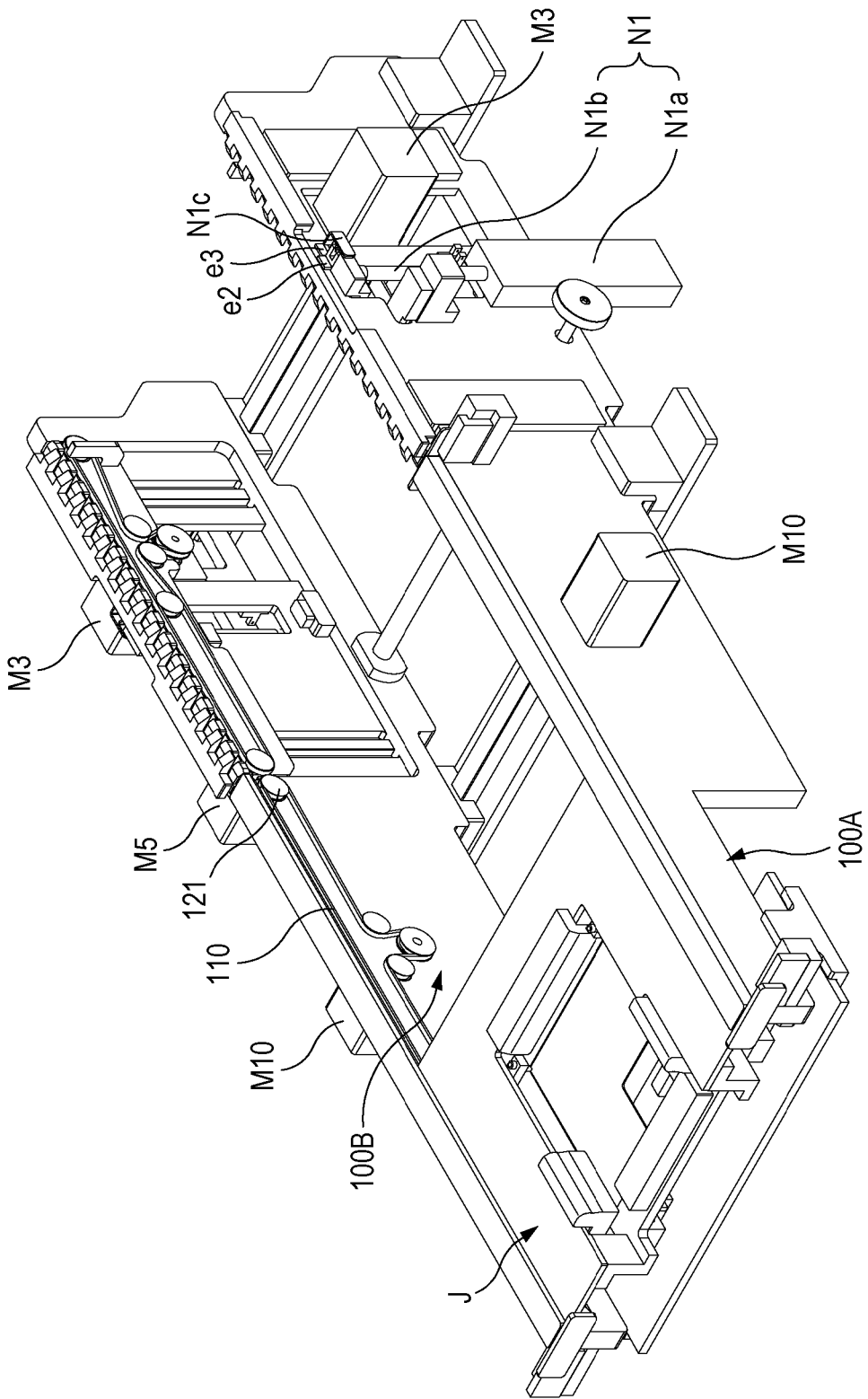
FIGS. 3 and 4 are perspective views of the transports 100A and 100B and the jig J shown in FIG. 2.
Figure 4:
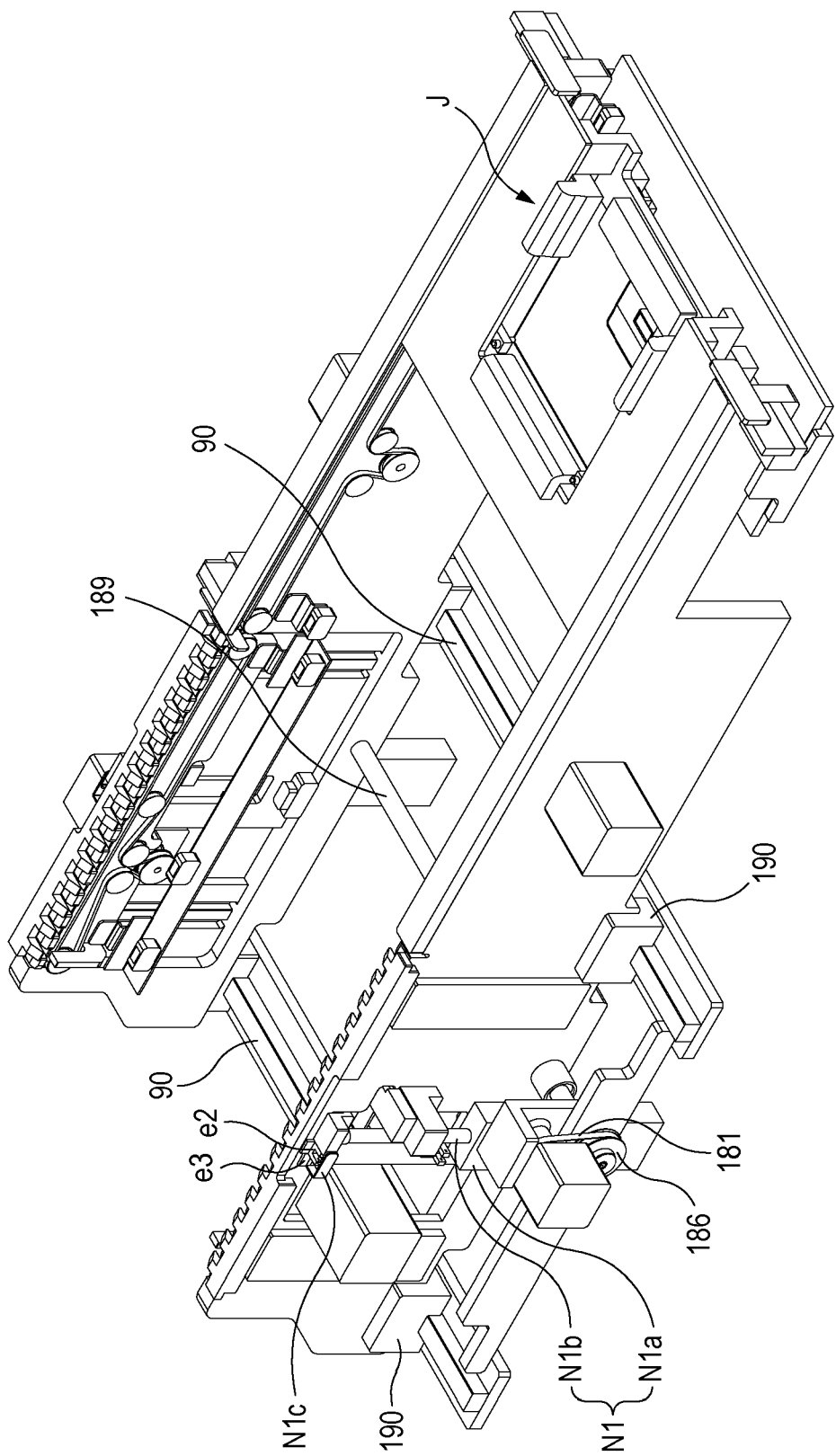
Figure 5:
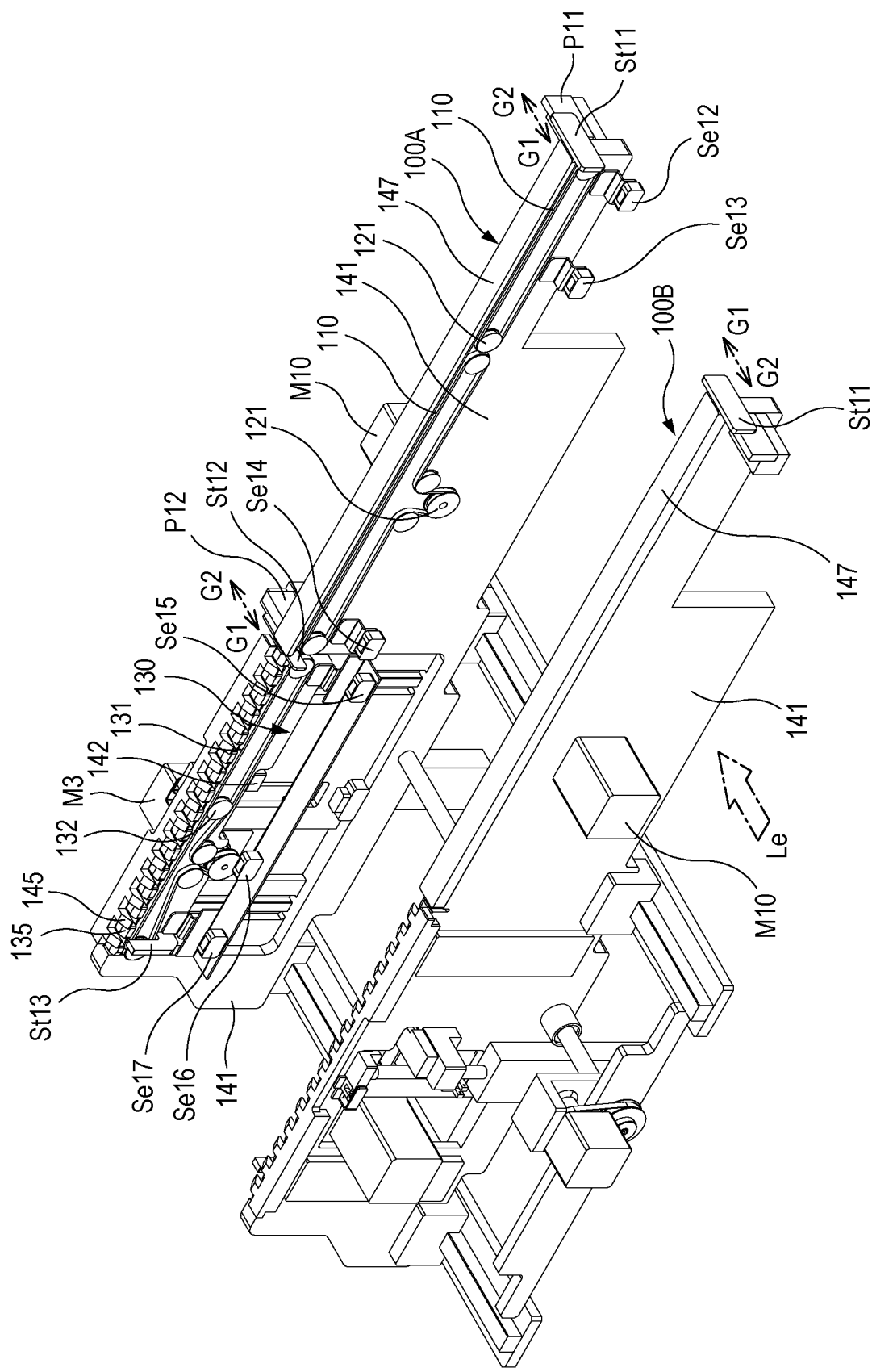
FIG. 5 is a perspective view showing a state in which the distance between the first transport 100A and the second transport 100B shown in FIG. 4 is changed.

FIGS. 3 and 4 are perspective views of the transports 100A and 100B and the jig J shown in FIG. 2. FIG. 5 is a perspective view showing a state in which the distance between the first transport 100A and the second transport 100B shown in FIG. 4 is changed. Referring to FIGS. 3 to 5, the inspection apparatus 1 includes a mover 110 configured to move the jig J. The mover 110 may include a transfer belt 110, may include a ball screw for transferring the jig J, or may include a robot arm for transferring the jig J. By moving the jig J, the object seated on the jig J may move together with the jig J.

The mover 110 may be configured to move the jig J in the front-rear direction in a state in which the jig is capable of slipping. The mover 110 may support the jig J. The mover 110 may include a transfer belt 110 configured to support the jig J and move the jig J in a rear direction or in a front direction. The jig J can be moved in the front-rear direction by the friction force between the transfer belt, on which the jig J is mounted, and the jig J. When a load greater than the static friction force is applied to the jig J due to the occurrence of an impact or the like, the jig J can slide with respect to the transfer belt. Pulleys 121, belts 122 and/or gears for operating the transfer belt 110 may be provided to transmit the rotational force of a motor M10 to the transfer belt 110. One example of the pulleys 121 and the belts 122 for transmitting the rotational force to the transfer belt 110 is shown in the drawings. However, the present disclosure is not limited thereto.

Each of the pair of transports 100A and 100B includes a mover 110. The pair of movers 110 provided in the pair of transports 100A and 100B may be arranged symmetrically in the left-right direction. The pair of transports 100A and 100B may be configured to be symmetrical in the left-right direction as a whole, and some components may be provided only in one of the pair of transports 100A and 100B. The following description of the transport 100 may be understood as a description of each of the pair of transports 100A and 100B.

The transport 100 includes a lifting part 130 configured to support the jig J and move the jig J in the up-down direction. The lifting part 130 includes a support part 131 configured to support the jig J that moves in the rear direction by the mover 110. The support part 131 may move the jig J in the front direction so that the jig J is supported by the mover 110. The support part 131 may include a transfer belt 131 configured to support the jig J and move the jig J in the rear direction or in the front direction. Pulleys 132, belts and/or gears for operating the transfer belt 131 may be provided to transmit the rotational force of a motor M3 to the transfer belt 131. One example of the pulleys 132 for transmitting the rotational force to the transfer belt 131 is shown in the drawings. However, the present disclosure is not limited thereto.

The support part 131, the pulleys 132 and the motor M3 are supported by the lifting part 130. The support part 131 may be moved up and down together with the lifting part 130. The object supported by the support part 131 may be moved up and down together with the lifting part 130.

The lifting part 130 includes a side guide 135 configured to guide the position of the jig J in the left-right direction by making contact with the side surface (left side surface or right side surface) of the jig J. The side guide 135 includes a plurality of protrusions protruding upward and spaced apart from each other in the front-rear direction. When the lifting part 130 moves up and down, the protrusions of the side guide 135 may be inserted between a plurality of protrusions of the upper end engaging part 145 and may be moved in the up-down direction.

The transport 100 includes a support frame 141 configured to support the mover 110. The support frame 141 supports the pulleys 121, the belts 122 and the motor M10. The support frame 141 supports the lifting part 130 so as to be movable in the up-down direction. The support frame 141 guides the up-down movement of the lifting part 130.

The support frame 141 is supported by the frame 60. The support frame 141 may be formed in a plate shape having a thickness in the left-right direction as a whole. The support frame 141 may be formed to extend in the front-rear direction as a whole.

The transport 100 includes a lower end stopper 142 configured to set the maximum downward movement position of the lifting part 130. The lower end stopper 142 may be fixed to the support frame 141. When the lifting part 130 moves downward, the lifting part 130 may come into contact with the lower end stopper 142.

The transport 100 includes an upper end engaging part 145 having a lower surface capable of making contact with the upper surface of the jig J. The upper end engaging part 145 may be fixed to the support frame 141. The upper end engaging part 145 has a plurality of protrusions protruding to a lateral side (left side or right side) and spaced apart from each other in the front-rear direction. When the lifting part 130 moves upward, the protrusions of the side guide 135 are inserted into gaps between the protrusions of the upper end engaging part 145.

The inspection apparatus 1 includes drivers M10, M3, M5 and N1 such as motors or cylinders fixed to the transport 100. The transport 100 may include driving force transmitting parts such as belts and pulleys that transmit the driving forces from the drivers M10, M3, M5 and N1 to operation configurations corresponding to the respective drivers M10, M3, M5 and N1.

The motor M10 provides a driving force to the mover 110. When the motor M10 rotates, the transfer belt 110 may operate. The motor M10 is supported by the support frame 141.

The motor M3 provides a driving force to the support part 131. When the motor M3 rotates, the transfer belt 131 may operate. The motor M3 is supported by the lifting part 130. The motor M3 moves up and down together with the lifting part 130.

The width adjustment motor M5 provides a driving force to change the left-right distance between the transports 100A and 100B. The width adjustment motor M5 is supported on the frame 60.

The lifting driver N1 provides a driving force for the up/down movement of the lifting part 130. The lifting driver N1 is supported by the support frame 141. For example, the lifting driver N1 may include a pneumatic cylinder N1$a$ and a cylinder rod N1$b$ to be moved in the up-down direction by the pneumatic cylinder N1$a$. A lifting target N1$c$ may be fixed to the cylinder rod N1$b$. When the cylinder rod (N1$b$) is moved to a preset upper limit position, a lifting sensor e2 detects the lifting target N1$c$ so that the control part connector recognize that the lifting part 130 has moved to the preset upper limit position. When the cylinder rod N1$b$ is moved to a predetermined position (a position lower than the upper limit position), a lifting sensor e3 detects the lifting target N1$c$ so that the control part can recognize that the lifting part 130 has moved to the predetermined position. The predetermined position may be set to a position at which the upper surface of the mover 110 and the upper surface of the support part are at the same level so that the jig J can move from one of the mover 110 and the support part 131 to the other.

With reference to FIGS. 4 and 5, a left-right width adjustment driving mechanism for the pair of transports 100A and 100B will be described as follows. The inspection apparatus 1 includes a frame guide 90 configured to guide the lift-right movement of at least one of the pair of transports 100A and 100B. The frame guide 90 may be fixed to the frame 60. The inspection apparatus 1 includes a driver M5 configured to provide a driving force for moving at least one (100B) of the pair of transports 100A and 100B in the left-right direction. The driver M5 may be the aforementioned width adjustment motor. In the present embodiment, the second transport 100B is configured to be movable in the left-right direction. However, the present disclosure is not limited thereto.

The at least one transport includes a slider 190 configured to slide along the frame guide 90. The width adjustment driving mechanism includes a driving force transmitting part such as pulleys, belts, gears and/or a lead screw that transmits the driving force of the driver M5 to the at least one transport. For example, the belts 181 and the pulleys 186 are rotated by the rotation of the motor M5, and the lead screw 189 is rotated by the rotation of the pulleys 186. When the lead screw 189 is rotated, one transport 100B is moved in the left-right direction along the lead screw 189. FIG. 4 shows a state in which the second transport 100B has moved to the right as far as possible, and FIG. 5 shows a state in which the second transport 100B has moved to the left Le.

Referring to FIG. 5, the inspection apparatus 1 may include at least one sensor Se12, Se13, Se14, Se15, Se16 or Se17 for detecting the jig J when the jig J is arranged at a predetermined position. The at least one sensor may be fixed to the transport 100. A plurality of sensors Se12, Se13, Se14, Se15, Se16 and Se17 may be provided. The at least one sensor may be arranged at a specific position to detect the jig J when the jig J is arranged in a sensing direction of the sensor. The sensing direction may be an upward direction.

The at least one sensor includes a sensor Se12 configured to detect the jig J when the jig J is arranged at a maximum forward movement position on the mover 110. The control part may determine whether to perform clamping and unclamping of the object B based on the detection result of the sensor Se12. The sensor Se12 may be disposed at the front end of the transport 100.

The inspection apparatus 1 includes a sensor Se13 configured to detect the jig J before the jig J comes into contact with a stopper St11 during the movement of the jig J from the rear side to the front side. The control part may reduce the forward movement speed of the jig J before the jig J comes into contact with the stopper St11, based on the detection result of the sensor Se13. The sensor Se13 may be disposed at a position more rearward than the position of the sensor Se12.

The inspection apparatus 1 includes a sensor Se14 configured to detect the jig J when the jig J comes into contact with a front portion of a stopper St12. The control part may recognize that the jig J is ready to move from the mover 110 to the lifting part 130, based on the detection result of the sensor Se14. The sensor Se14 may be disposed at a position more frontward than the position of the stopper St12.

The inspection apparatus 1 includes a sensor Se15 configured to detect the jig J when the jig J is located across the front-rear direction boundary between the mover 110 and the support part 131. The control part may recognize whether the jig J straddles the mover 110 and the lifting part 130, based on the detection result of the sensor Se15. The sensor Se15 may be disposed at the front end of the lifting part 130.

The inspection apparatus 1 includes a sensor Se17 configured to detect the jig J when the jig J is arranged at a maximum rearward movement position on the support part 131. The sensor Se17 may detect the jig J while the jig J is in contact with a rear end stopper St13. The control part may determine whether to perform the lifting operation of the lifting part 130, based on the detection result of the sensor Se17. The sensor Se17 may be disposed at the rear end of the lifting part 130.

The inspection apparatus 1 includes a sensor Se16 configured to detect the jig J before the jig J comes into contact with a rear end stopper St13 during the movement of the jig J from the front side to the rear side. The control part may reduce the rearward movement speed of the jig J before the jig J comes into contact with the rear end stopper St13, based on the detection result of the sensor Se16. By reducing the rotational speed of the transfer belt 131, it is possible to reduce the rearward movement speed of the jig J. The sensor Se16 may be disposed at a position more frontward than the position of the sensor Se17.

The inspection apparatus 1 includes a rear end stopper St13 configured to limit the maximum rearward movement position of the jig J that moves in the rear direction along the support part 131. The rear end stopper St13 may be fixed to the lifting part 130 to move in the up-down direction together with the lifting part 130.

The inspection apparatus 1 includes a stopper St11 configured to limit the maximum forward movement position of the jig J. The stopper St11 is configured to be able to make contact with the front end of the jig J when the jig J is moved in the front direction by the mover 110. The stopper St11 is supported by the transport 100. The stopper St11 is configured to be movable in predetermined directions G1 and G2.

The inspection apparatus 1 includes a stopper driver P11 configured to move the stopper St11 in a stopping direction G1 and a releasing direction G2. In the present embodiment, the stopper driver P11 includes a pneumatic cylinder. The stopper driver P11 may include a motor or the like.

When the stopper St11 has moved in the stopping direction G1, the front end of the jig J may make contact with the rear surface of the stopper St11. When the stopper St11 has moved in the releasing direction G2, the rear surface of the stopper St11 may deviate from the front side of the jig J to the lateral side thereof so that the jig J can move in the front direction without interference of the stopper St11. In a state in which the stopper St11 has moved in the releasing direction G2, the jig J may be withdrawn from or introduced into the transport 100 (see FIG. 6). This makes it convenient to replace the jig in the inspection apparatus.

The inspection apparatus 1 includes a stopper St12 configured to make contact with the rear end of the jig J when the jig J is moved in the rear direction by the mover 110. The stopper St12 is configured to make contact with the front end of the jig J when the jig J is moved in the front direction by the support part 131 such as a transfer belt or the like. The stopper St12 may be arranged at a front-rear direction boundary between the mover 110 and the support part 131. The stopper St12 is supported by the transport 100. The stopper St12 is configured to be movable in predetermined directions G1 and G2.

The inspection apparatus 1 includes a stopper driver P12 configured to move the stopper St12 in the stopping direction G1 and the releasing direction G2. In the present embodiment, the stopper driver P12 includes a pneumatic cylinder. The stopper driver P12 may include a motor or the like.

When the stopper St12 has moved in the stopping direction G1, the rear end of the jig J may make contact with the front surface of the stopper St12. When the stopper St12 has moved in the stopping direction G1, the front end of the jig J may make contact with the rear surface of the stopper St12. When the stopper St12 has moved in the releasing direction G2, the stopper St12 may deviate from the movement path of the jig J to the lateral side thereof so that the jig J can move in the front direction or in the rear direction without interference of the stopper St12.

Figure 6:
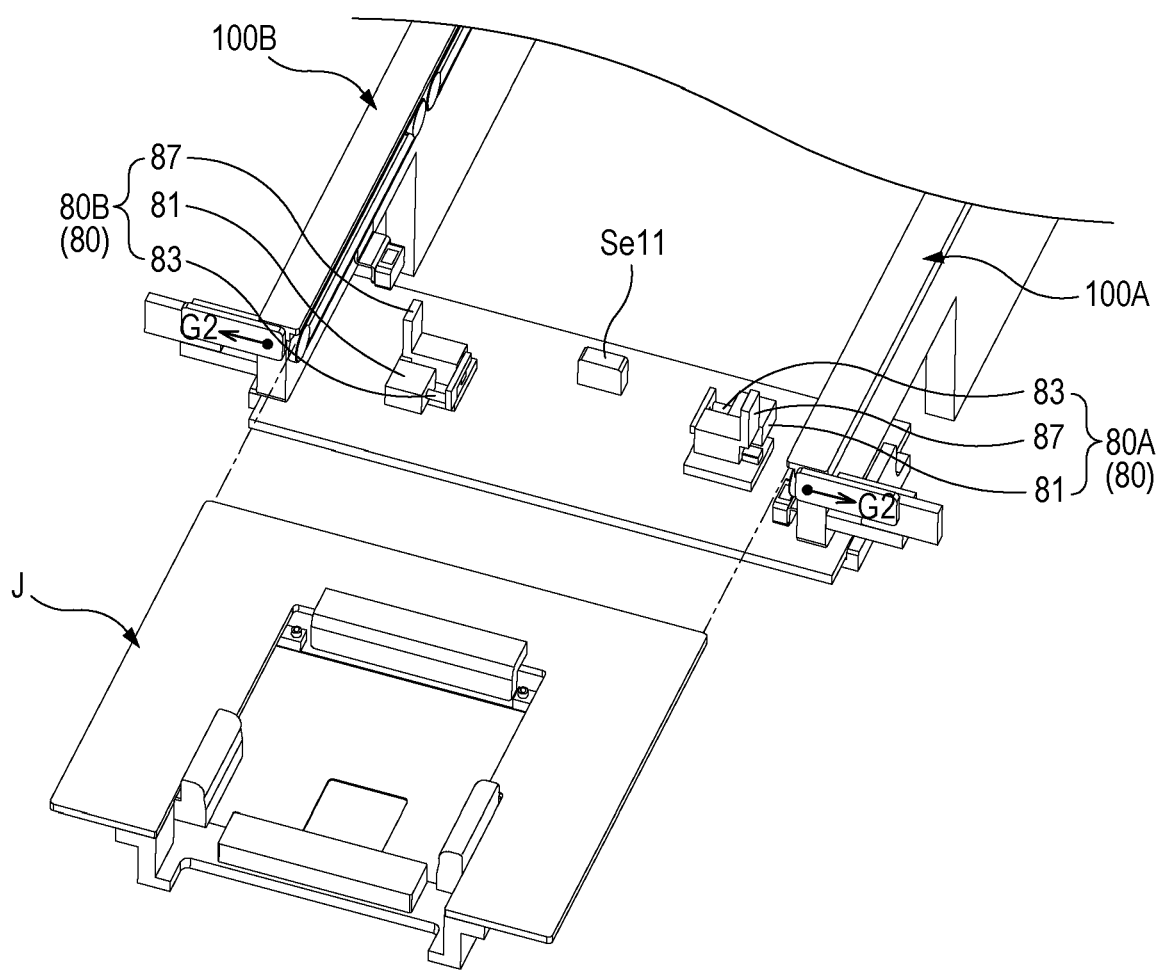
FIG. 6 is a partial perspective view showing a state in which the jig J is not yet introduced into the transports 100A and 100B shown in FIG. 4.
Figure 7:
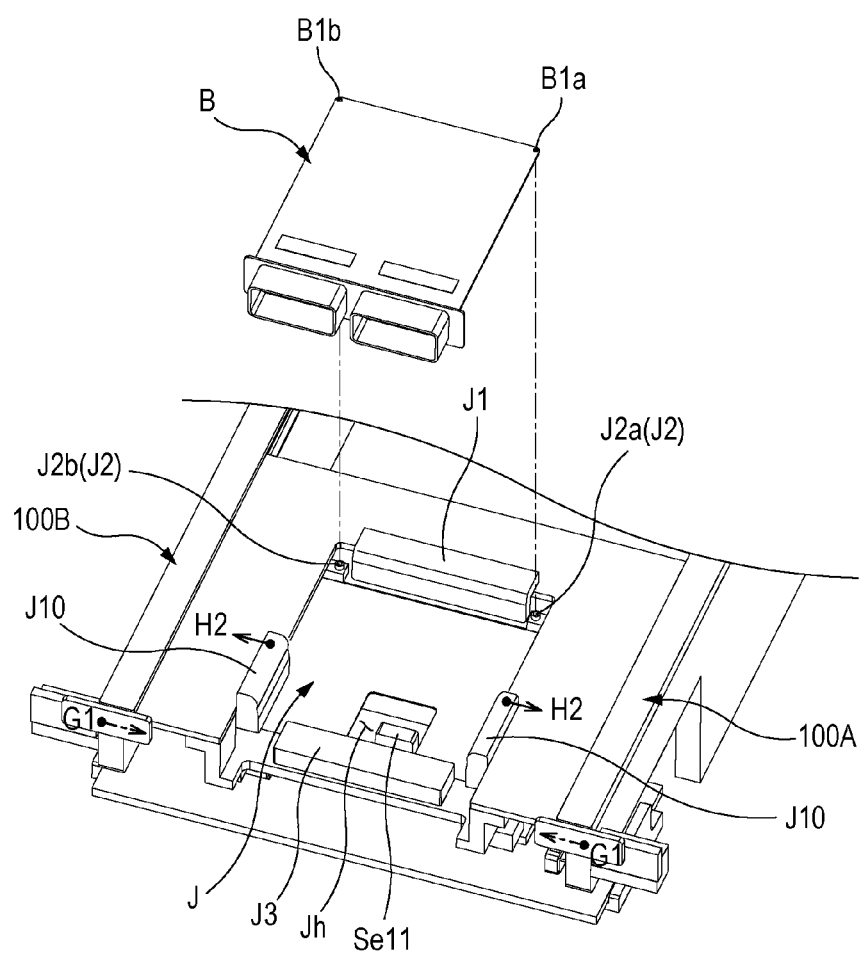
FIG. 7 is a partial perspective view showing a state in which the jig J is introduced into the transports 100A and 100B shown in FIG. 6 and the object B is not yet seated on the jig J.
Figure 8:
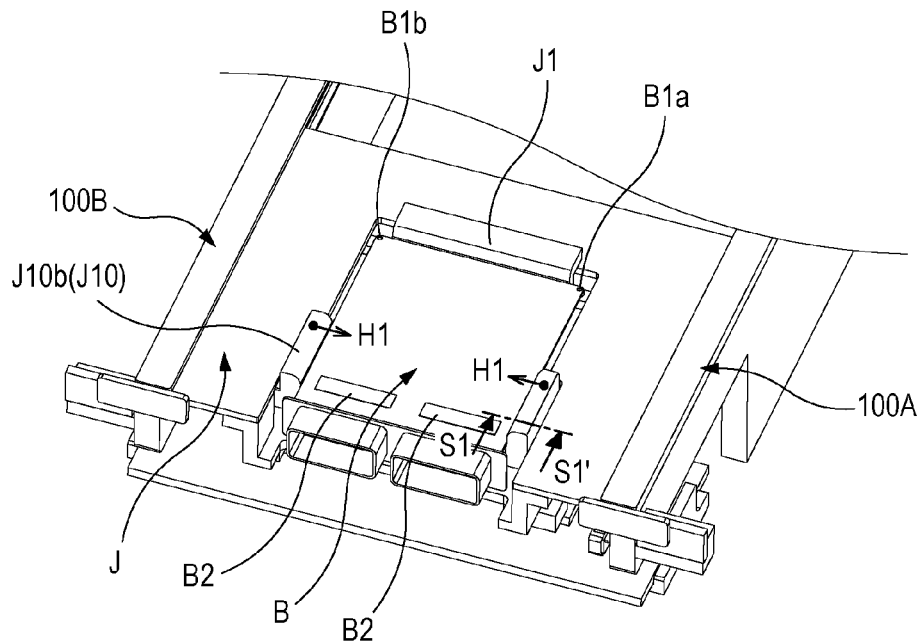
FIG. 8 is a partial perspective view showing a state in which the object B is seated on the jig J introduced into the transports 100A and 100B shown in FIG. 7.

FIG. 6 is a partial perspective view showing a state in which the jig J is not yet introduced into the transports 100A and 100B shown in FIG. 4. FIG. 7 is a partial perspective view showing a state in which the jig J is introduced into the transports 100A and 100B shown in FIG. 6 and the object B is not yet seated on the jig J. FIG. 8 is a partial perspective view showing a state in which the object B is seated on the jig J introduced into the transports 100A and 100B shown in FIG. 7.

Referring to FIGS. 6 to 8, the inspection apparatus 1 includes a sensor Se11 configured to detect whether the object B is disposed. The sensing direction of the sensor Se11 may be an upward direction. The sensor Se11 is arranged at a position spaced downward from the jig J. The sensor Se11 may be fixed to the transport 100 or the frame 60. In the state of FIG. 8, the sensor Se11 may detect the object B.

A sensing opening Jh is formed in the jig J in the sensing direction of the sensor Se11 based on the state in which the jig J is located at the maximum forward movement position. The jig J includes a guide wall J1 configured to be able to make contact with the side surface (e.g., the rear side surface) of the object B. The jig J includes guide pins J2 configured to be inserted into the grooves or holes B1$a$ and B1$b$ of the object B. The jig J may include a plurality of guide pins J2$a$ and J2$b$. The jig J includes a guide step J3 configured to be able to make contact with the lower surface of the object B.

For example, the correct position of the object B may be set by the guide wall J1 and the guide pins J2. The guide wall J1 may be located on the rear side of the jig J to set the position in the first entry direction (the rear direction) of the object B. The final correct position of the object B with respect to the jig may be set by the guide pins J2 inserted into the grooves or holes B1$a$ and B1$b$ of the object B.

Referring to FIGS. 7 and 8, in the present embodiment, the object B is a substrate such as a printed circuit board (PCB) or the like. In another embodiment, the object B may be various other parts or products. Connectors may be attached to a substrate by a pin insertion method. The inspection apparatus 1 may inspect the insertion state of the pins inserted into the substrate. For example, a portion of the object B may be an inspection target portion B2.

Figure 9:
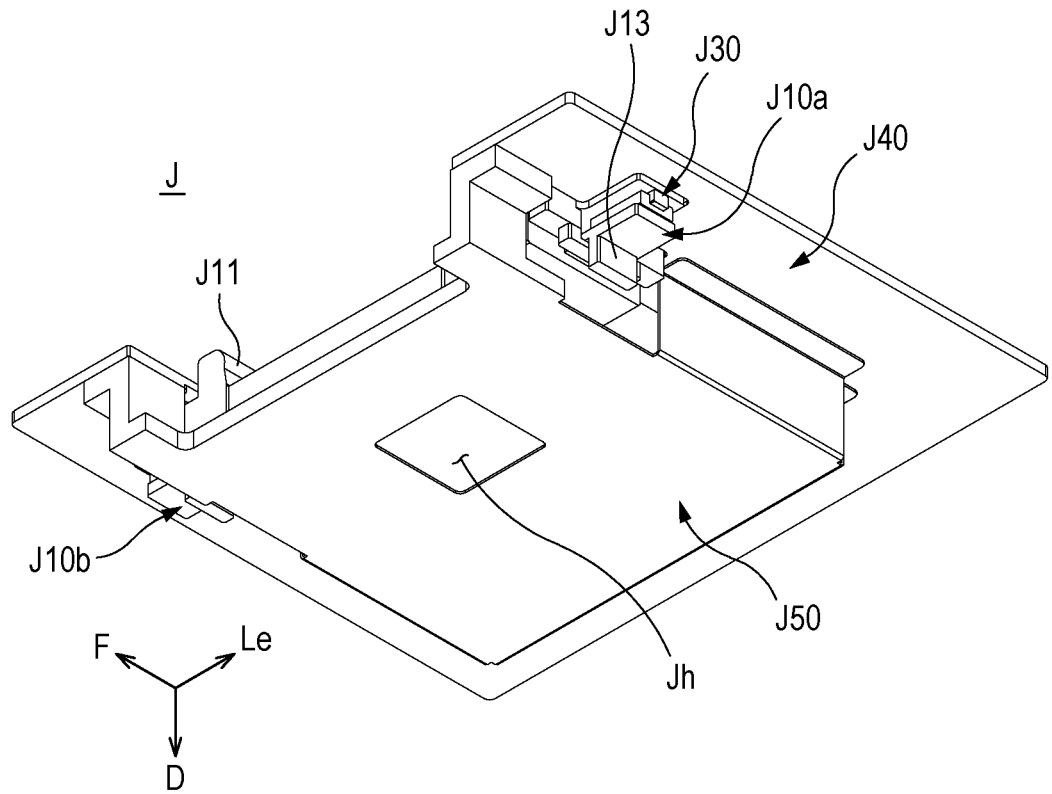
FIG. 9 is a perspective view of the jig J shown in FIG. 8.
Figure 10:
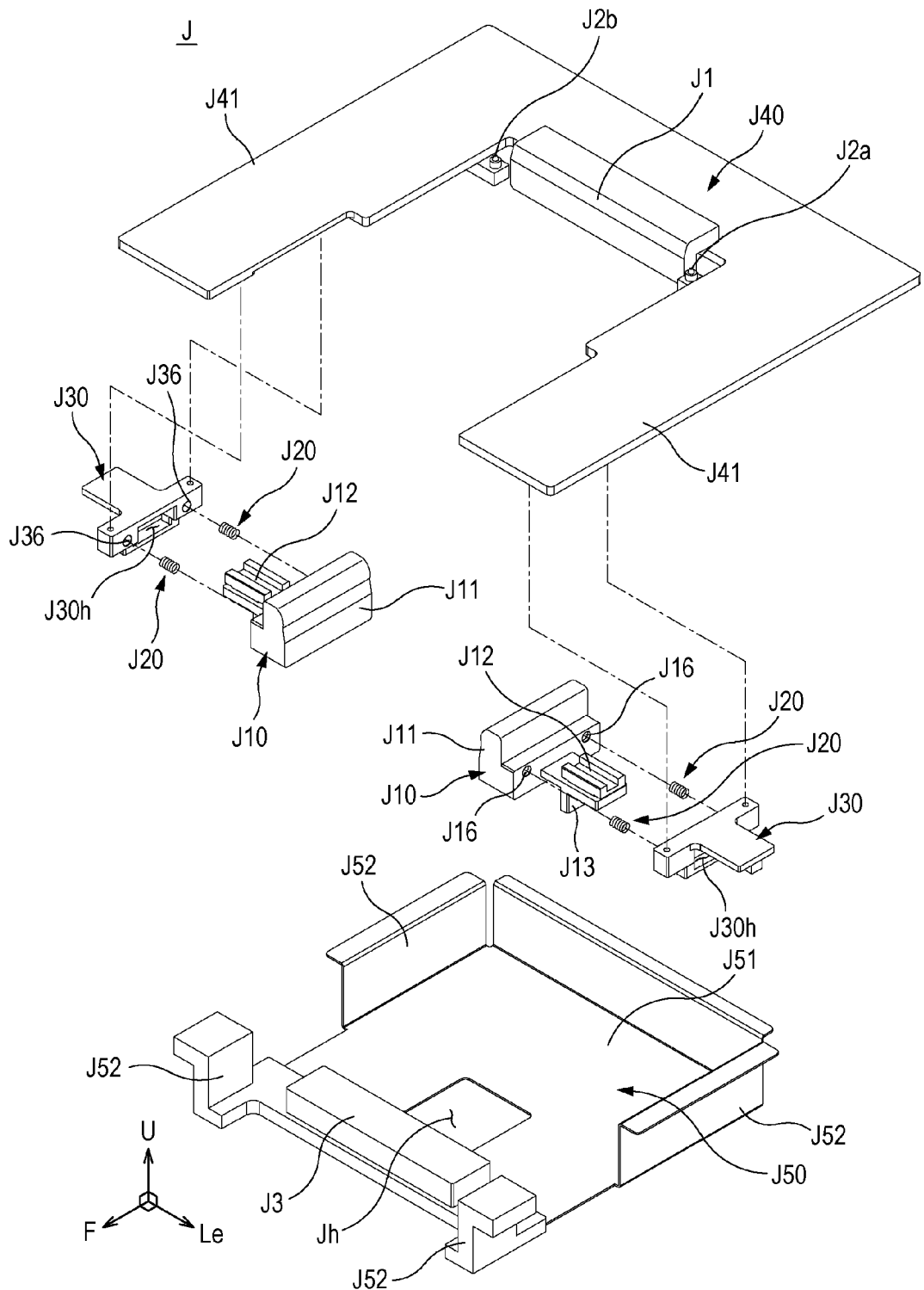
FIGS. 10 and 11 are exploded perspective views of the jig J shown in FIG. 9.
Figure 11:
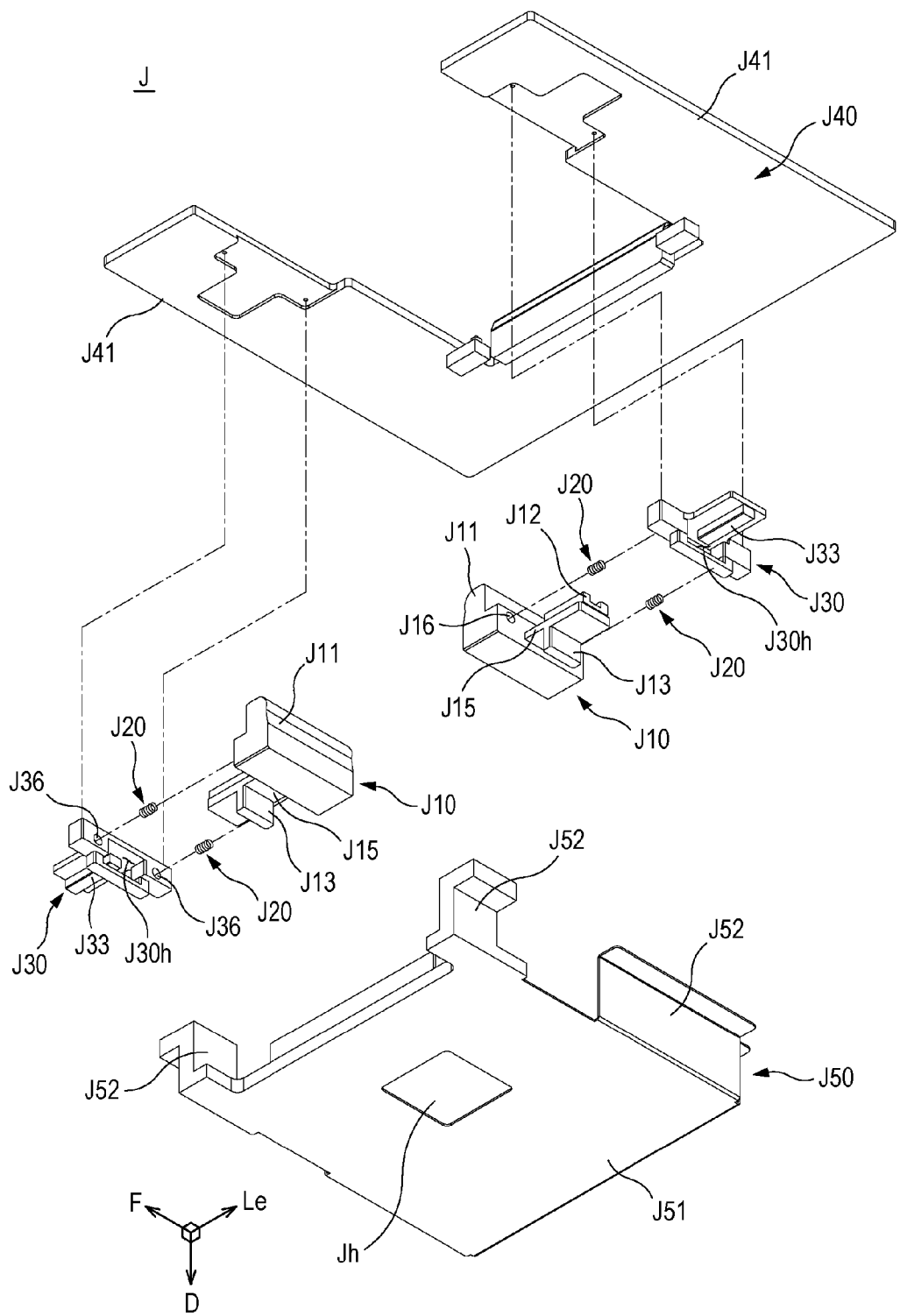
Figure 12B:
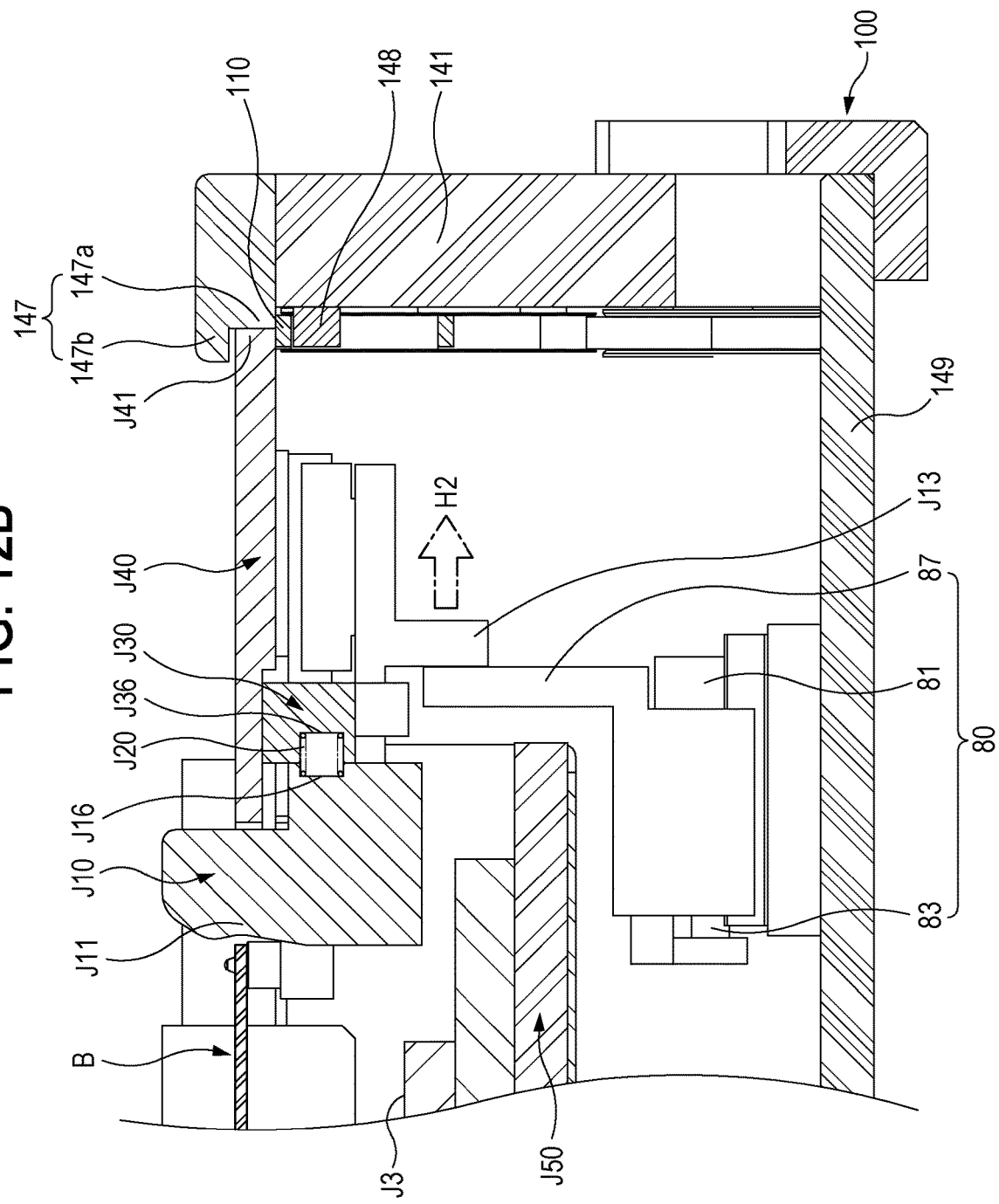

FIG. 9 is a perspective view of the jig J shown in FIG. 8. FIGS. 10 and 11 are exploded perspective views of the jig J shown in FIG. 9. FIGS. 12A and 12B are partial sectional views of the transport 100, the jig J and the object B taken along line S1-S1' in FIG. 8, wherein FIG. 12A shows a state in which the object B is clamped and FIG. 12B shows a state in which the object B is unclamped. Referring to FIGS. 9 to 12B, the jig J includes one or more dampers J10 configured to clamp the object B. The one or more dampers J10 may include a pair of dampers J10a and J10b. The jig J includes a clamping guide J30 configured to guide the movement direction of the dampers J10. The jig J includes an elastic member J20 configured to provide an elastic force for pressing the dampers J10 in a clamping direction H1. The jig J includes a support J40 configured to be supported by the transport 100. The jig J includes a lower cover J50 fixed to the support J40.

The inspection apparatus 1 includes one or more clamping drivers 80 configured to move the dampers. The one or more clamping drivers 80 may include a pair of clamping drivers 80A and 80B corresponding to the pair of dampers J10. In the present embodiment, the clamping drivers 80 are supported by the transport 100. In another embodiment, the clamping drivers 80 may be directly supported by the frame 60. For example, clamping drivers 80 may be arranged on an auxiliary frame 149 fixed to the support frame 141.

The dampers J10 are movable in a clamping direction H1 in which the object B is clamped to the jig J. The dampers J10 are movable in an unclamping direction H2 opposite to the clamping direction H1. The clamping direction H1 is preset such that the object B is clamped to the jig J when the dampers J10 move in the clamping direction H1. The respective clamping directions H1 of the dampers J10a and J10b may not be identical to each other. In the present embodiment, the clamping direction H1 of the first damper J10a and the clamping direction of the second damper J10b are opposite to each other. In the present embodiment, the clamping direction H1 is a left direction or a right direction.

The damper J10 includes an object contact portion J11 configured to be able to make contact with the object B. The object contact portion J11 may form a surface that makes contact with the object B in the clamping direction H1. The object contacting portion J11 may include a portion protruding upward, and the protruding portion may form a surface that makes contact with the object B in the clamping direction H1. The surface of the object contact portion J11 in the clamping direction H1 may include a recessed portion, and the object B may be clamped by making contact with the recessed portion of the surface of the object contact portion J11.

The damper J10 includes a driving contact portion J13 configured to be able to make contact with the inspection apparatus 1 so as to receive a driving force for moving the damper J10. The driving contact portion J13 may include a surface in the clamping direction H1, which can make contact with a pressing portion 87 of the inspection apparatus 1. The driving contact portion J13 may protrude downward. The driving contact portion J13 may be formed to protrude downward from the slider J12.

The damper J10 includes a slider J12 configured to be guided in the movement direction of the damper J10. The slider J12 may be arranged on a guide portion J33 so as to be movable in the clamping direction H1 and the unclamping direction. The slider J12 may form a guide groove configured to receive the guide portion J33 is and extending in the clamping direction H1. The slider J12 may be formed to protrude in the unclamping direction H2.

The damper J10 may include a penetration portion J15 passing through the guide hole J30h of the clamping guide J30. The driving contact portion J13 may be connected to the clamping direction H1 side of the penetration portion J15. The slider J12 may protrude from the penetration portion J15 in the unclamping direction H2.

The clamping guide J30 includes a guide portion J33 configured to guide the movement of the slider J12. The guide portion J33 may protrude downward and extend in the clamping direction H1. The clamping guide J30 is fixed to the support J40. The clamping guide J30 may form a guide hole J30h extending in the clamping direction H1. The guide hole J30h may be positioned on the clamping direction H1 side of the guide portion J33.

When the damper J10 moves in the unclamping direction H2, the elastic member J20 is elastically deformed. When the damper J10 moves in the clamping direction H1, the elastic member J20 is elastically restored. Referring to FIG. 12A, the elastic member J20 is configured to be elastically deformed as the pressing portion 87 presses the damper J10 in the unclamping direction H2. Referring to FIG. 12B, the pressing portion 87 is configured to be spaced apart from the damper J10 as the pressing portion 87 moves in the clamping direction H1. As the pressing portion 87 moves in the clamping direction H1, the damper J10 is moved in the clamping direction H1. Even after the damper J10 comes into contact with the object B, the pressing portion 87 may continue to move in the clamping direction H1 and may be spaced apart from the damper J10.

A plurality of elastic members J20 may be supported by one damper J10. One end of the elastic member J20 may be supported by the clamping guide J30 and the other end thereof may be supported by the damper J10. A first seating portion J16 of the clamping guide J30 may form a groove into which one end of the elastic member J20 is inserted. A second seating portion J36 of the damper J10 may form a groove into which the other end of the elastic member J20 is inserted.

The elastic member J20 may be one of various known elastic members that exert an elastic force. For example, the elastic member J20 may include various springs such as a compression spring, a tension spring, a torque spring and the like, or may include members made of elastically compressible materials such as rubber and the like. In the present embodiment, the elastic member J20 is a compression spring.

For example, the operation of fixing the object B may be performed by using the elastic force of the elastic member J20. The damper J10 may clamp the object B by the elastic force of the elastic member J20. The object B may be unclamped by moving the damper J10 with the clamping driver 80 such as a pneumatic cylinder or the like disposed in the inspection apparatus 1. By setting the operation of unclamping the object B to be automatically completed after the inspection of the object B is finished, it is possible to complete the unloading operation of the object in one step.

The lower cover J50 is arranged to cover at least a portion of the lower portion of the object B. The lower cover J50 includes a lower portion J51 configured to form a lower surface. The lower cover J50 includes a side portion J52 extending upward from the edge of the lower portion J51 and coupled to the support J40. The guide step J3 may be disposed above the lower cover J50. The sensing opening Jh may be formed in the lower portion J51.

The support J40 supports the damper J10. The support J40 supports the clamping guide J30 and the lower cover J50. The support J40 includes a transfer support portion J41 supported by the transport 100. The mover 110 may make contact with the lower surface of the transfer support portion J41. The left end or right end of the transfer support portion J41 may be guided by a side end guide portion 147a. The upper surface of the transfer support portion J41 may be guided by an upper end guide portion 147b. The transfer support portion J41 may be formed at one end of the support J40. A pair of transfer support portions J41 may be formed at the left and right ends of the support J40.

Referring to FIGS. 12A and 12B, the transport 100 may include a guide 147 configured to guide the movement direction of the jig J. The guide 147 may be fixed to the upper end of the support frame 141. The guide 147 may include a side end guide portion 147a having a surface facing the left end or right end of the jig J. The guide 147 may include an upper end guide portion 147b having a surface facing the upper side of the jig J. The upper end guide portion 147b may be connected to the upper end of the side end guide portion 147a.

In addition, the transport 100 may include a belt support portion 148 configured to support the lower surface of the transfer belt 110. The belt support portion 148 may protrude laterally from the support frame 141 and extend in the front-rear direction. This makes it possible to prevent the transfer belt 110 from sagging downward due to the load of the jig J.

The clamping driver 80 provides a driving force for operating the damper J10. The clamping driver 80 is configured to be able to contact and press the jig J. The clamping driver 80 is configured to be able to contact and press the damper J10 of the jig J.

The clamping driver 80 includes a pressing portion 87 configured to be movable in the clamping direction H1 and the unclamping direction H2. The pressing portion 87 is configured to press the damper J10 in the unclamping direction H2.

Referring to FIG. 12A, when the pressing portion 87 moves in the clamping direction H1, the pressing portion 87 may be spaced apart from the driving contact portion J13. At this time, the elastic member J20 is elastically restored to push the damper J10 in the clamping direction H1. The damper J10 comes into contact with the object B, and the object B is clamped to the jig J.

Referring to FIG. 12B, when the pressing portion 87 moves in the unclamping direction H2, the pressing portion 87 contacts and pushes the driving contact portion J13 of the jig J. At this time, the elastic member J20 is elastically deformed. The damper J10 is spaced apart from the object B, and the object B is unclamped from the jig J.

The clamping driver 80 may include a driver 81 such as a motor or a pneumatic cylinder that provides a driving force for moving the pressing portion 87. For example, the pressing portion 87 fixed to a cylinder rod 83 may be moved by moving the cylinder rod 83 in the clamping direction H1 or the unclamping direction H2 by the pneumatic cylinder 81.

The pressing portion 87 and the driving contact portion J13 may be configured to face each other in a state in which the jig J is located at a predetermined position with respect to the inspection apparatus 1. The predetermined position of the jig J with respect to the inspection apparatus 1 may be preset as a position at which the object B is loaded on the jig J. In the present embodiment, the predetermined position is a position at which the jig J is located at the front end of the mover 110. The driving contact portion J13 is a portion of the jig J and may be moved by the mover 110. In a state in which the jig J is located at the predetermined position, the pressing portion 87 may face the driving contact portion J13. The pressing portion 87 may move in the unclamping direction H2 while facing the driving contact portion J13 and may press the driving contact portion J13.

The jig J may be configured to be introduced into and withdrawn from the inspection apparatus 1 in a direction perpendicular to the clamping direction H1. Thus, the jig J can be introduced into or withdrawn from the inspection apparatus 1 in a state in which the pressing portion 87 and the driving contact portion J13 do not interfere with each other. In the present embodiment, the jig J may be introduced into the inspection apparatus 1 while moving in the rear direction, and may be withdrawn from the inspection apparatus 1 while moving in the front direction.

The mover 110 may be configured to move the jig J in a direction perpendicular to the clamping direction H1. Thus, the jig J can be moved by the mover 110 in a state in which the pressing portion 87 and the driving contact portion J13 do not interfere with each other. In the present embodiment, the jig J may be moved in the front-rear direction by the mover 110.

Figure 14:
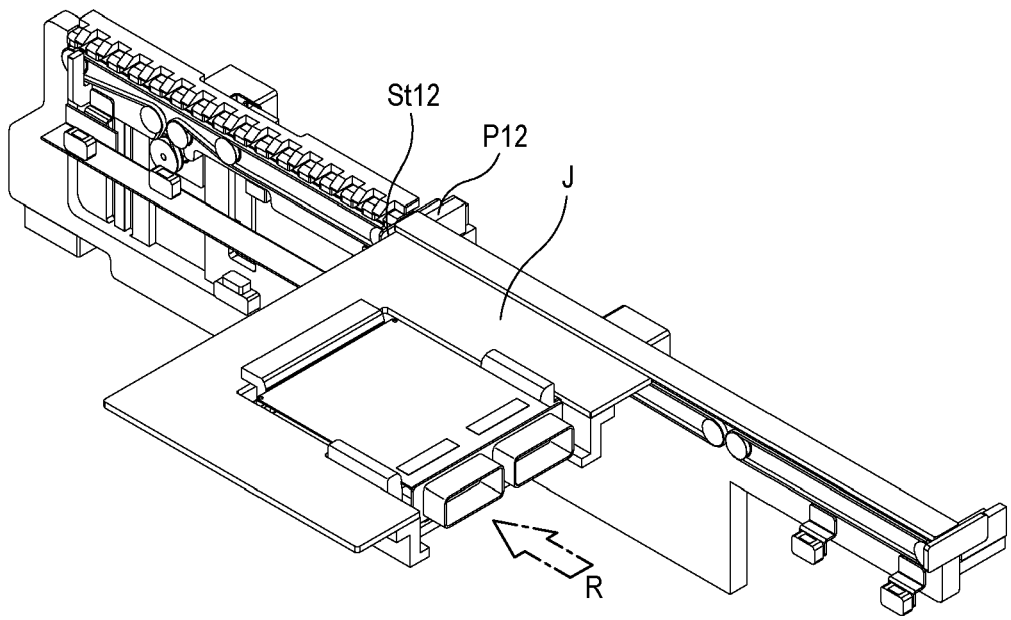
Figure 15:
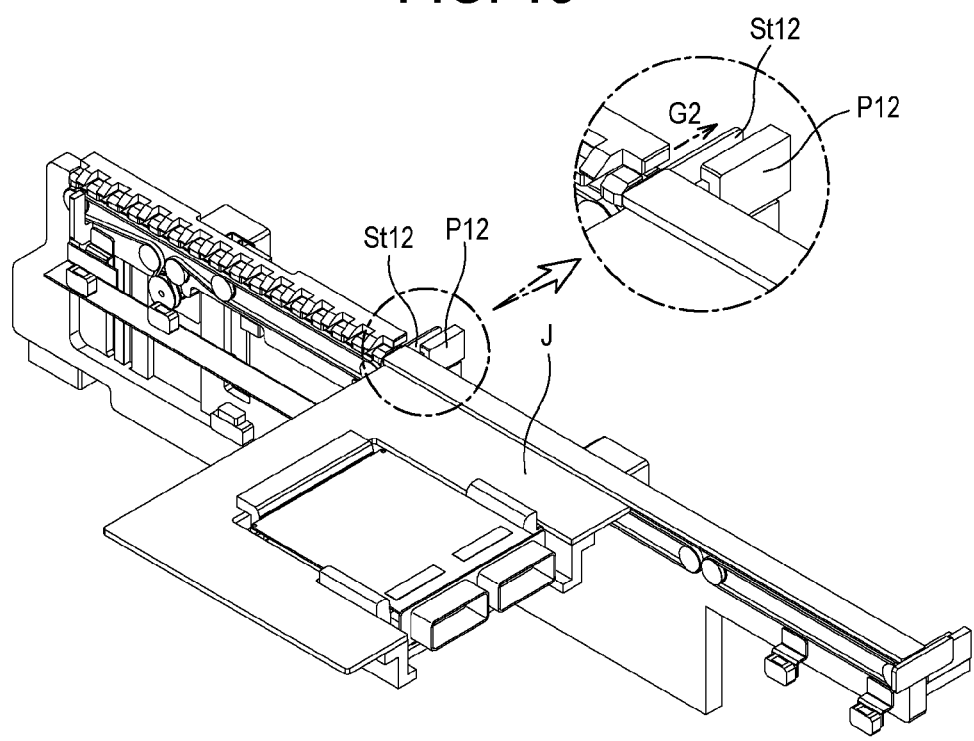
Figure 16:
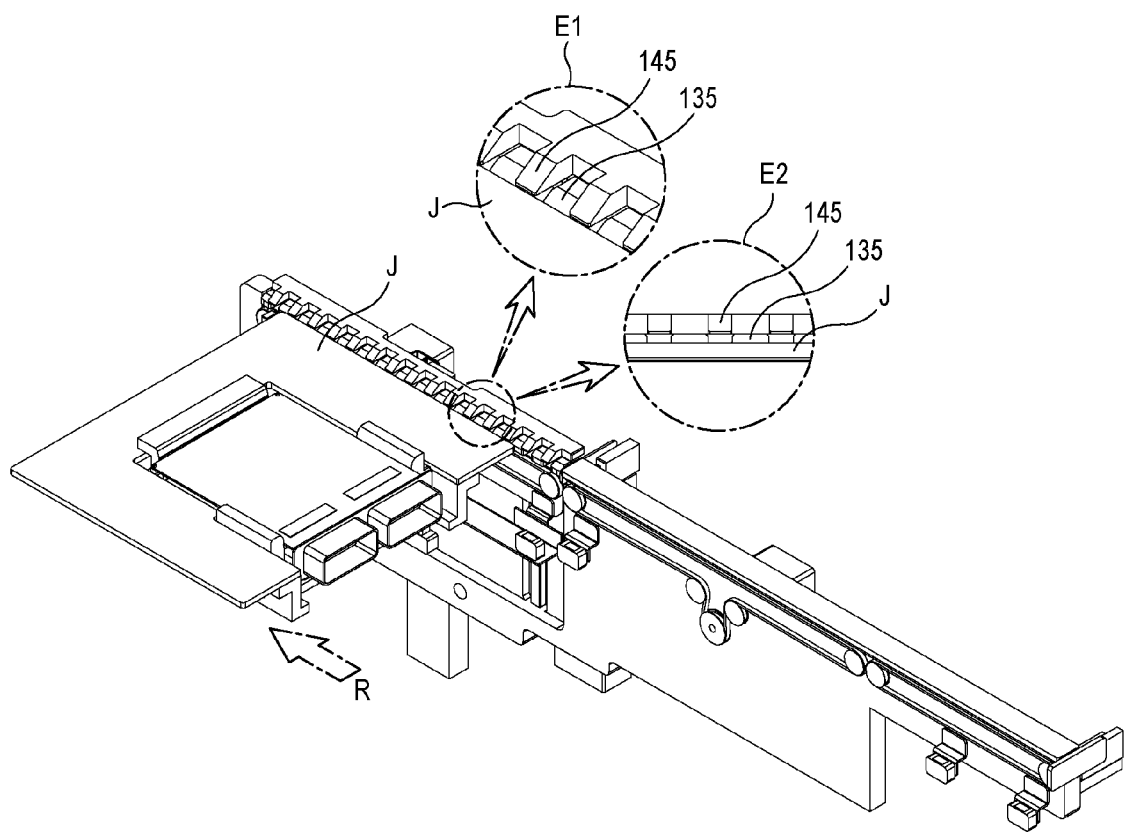
Figure 17:
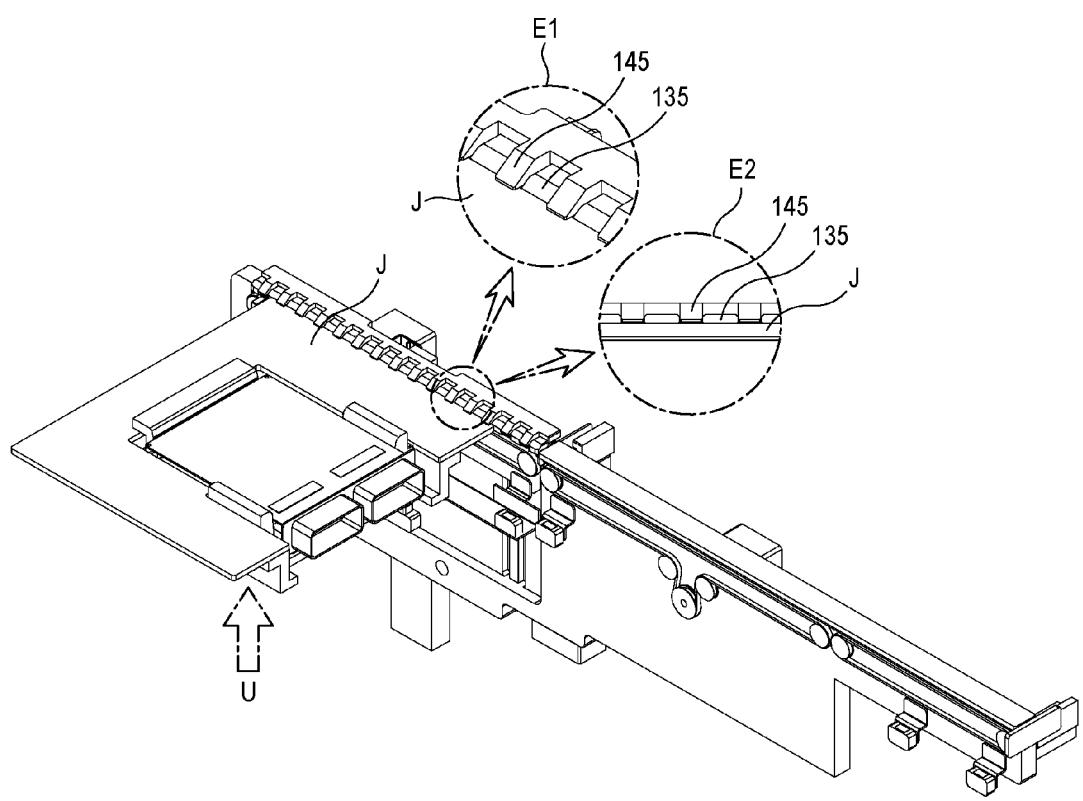
Figure 18:
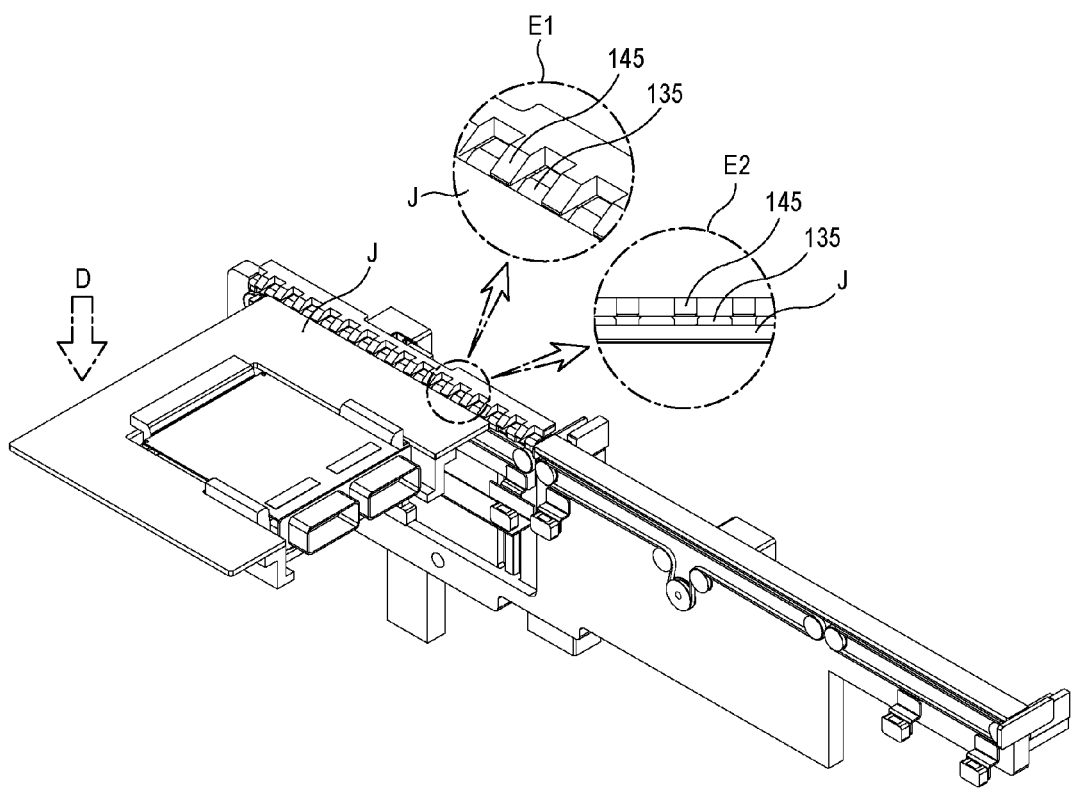

FIGS. 13 to 19 are perspective views illustrating the operations of the mechanism during the inspection process of one cycle based on one (100A) of the pair of transports 100A and 100B shown in FIG. 3. FIGS. 16 to 18 are partially enlarged perspective views E1 and partially elevation views E2 as viewed from the right side. FIG. 20 is a flowchart of an object inspection method according to one embodiment of the present disclosure. Referring to FIGS. 13 to 20, the object inspection method and the operations of the mechanism in individual steps will be described as follows. The object inspection method and the operations of the mechanism may be controlled by the control part. The object inspection method may use the inspection set described above.

Although process steps, method steps, algorithms, etc. are illustrated in a sequential order in the flowchart shown in the present disclosure, such processes, methods, and algorithms may be configured to be operated in any suitable order. In other words, the steps in the processes, methods, and algorithms explained in various embodiments of the present disclosure are not necessarily performed in the order described in the present disclosure. Further, even though some steps are explained as being performed non-simultaneously, such steps may be simultaneously performed in another embodiment. Moreover, the illustration of the processes depicted in the figure does not mean that the illustrated processes exclude other changes and modifications thereto, that any of the illustrated processes or the steps thereof is essential for at least one of various embodiments of the present disclosure, and that the illustrated processes are desirable.

Figure 13:
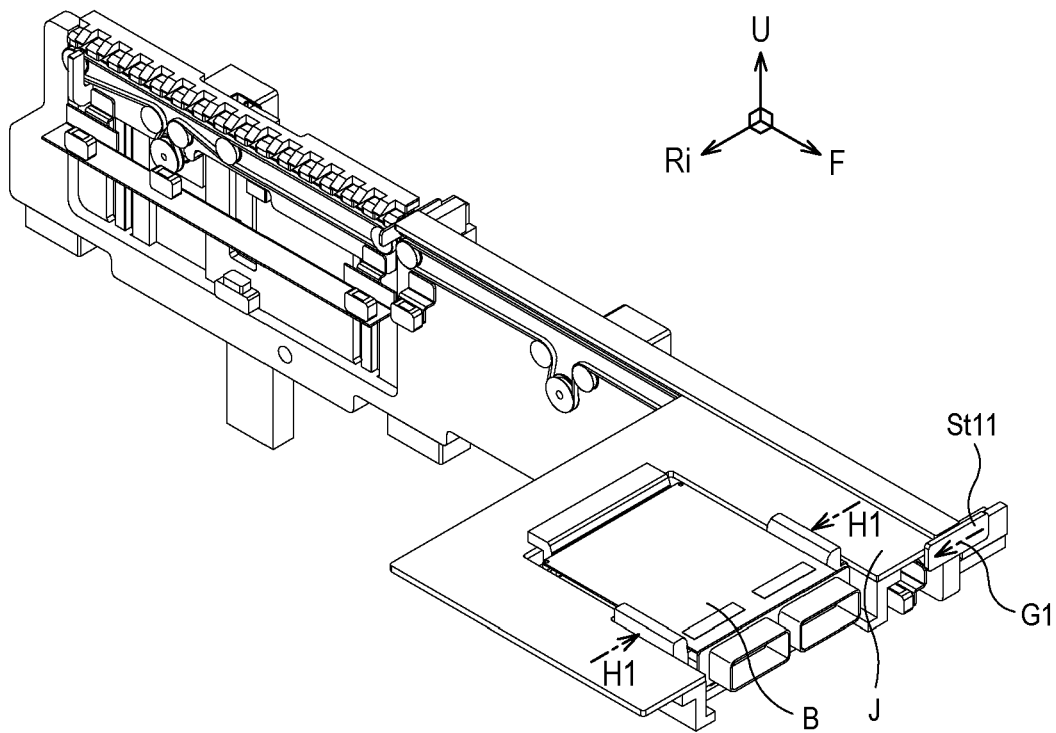
FIGS. 13 to 19 are perspective views illustrating the operation of the transport during an inspection process of one cycle based on the transport 100A of the pair of transports 100A and 100B shown in FIG. 3.

Referring to FIG. 13, the object inspection method includes step S1 of seating and fixing the object B on the jig J. The step S1 includes a loading step S10 of seating the object B on the jig J in a state in which the damper J10 has moved in the unclamping direction H2. The loading step S10 may be performed by an operator or a machine. The step S1 includes a clamping step S20 of clamping the object B to the jig J by moving the damper J10 in the clamping direction H1 after the loading step S10. The clamping step S20 may be performed when the control part receives an input signal from the start input part 31.

Referring to FIGS. 14 to 16, the object inspection method includes a rearward movement step of moving the jig J in the rear direction R. A first movement step S30 may include the rearward movement step. Referring to FIG. 14, the jig J placed on the mover 110 is moved in the rear direction R as the mover 110 operates, and is stopped by the stopper St12. Referring to FIG. 15, the stopper St12 is moved in the releasing direction G2. Referring to FIG. 16, the jig J is moved in the rear direction R and is placed on the support part 131. At this time, the jig J comes into contact with the rear end stopper St13.

Referring to FIG. 17, the object inspection method may further include an upward movement step of moving the jig J upward U after the first movement step S30. The lifting part 130 is moved upward together with the jig J, and the upper end of the jig J comes into contact with the lower surface of the upper end engaging part 145. At this time, the upper ends of the plurality of protrusions of the side guide 135 may be inserted between the protrusions of upper end engaging part 145.

The object inspection method includes an inspection step S40 of inspecting the object B with the image sensor after the first movement step S30. The inspection step S40 may be performed after the upward movement step. In the inspection step S40, the image sensor may be moved by the image sensor moving device 70. The inspection step S40 may be performed in a state in which the upper end of the jig J is in contact with the lower surface of the upper end engaging part 145.

The control part may determine whether the object B is defective, based on the detection signal of the image sensor. The control part may control the output part 20 to output predetermined information according to the inspection result. When it is determined based on the detection signal of the image sensor that the object is defective, the control part may control the output part 20 to output information on a defective portion so that an operator can directly determine whether the object is defective. When it is determined based on the detection signal of the image sensor that the object is normal, the control part may perform the following process.

Referring to FIG. 18, the object inspection method may include a downward movement step of moving the jig J downward D after the inspection step S40. A second movement step S50 includes the downward movement step. In the downward movement step, the lifting part 130 is moved downward so that the upper surface of the support part 131 is located at the same level as the upper surface of the mover 110. At this time, the lifting part 130 comes into contact with the lower end stopper 142. At this time, the upper ends of the plurality of protrusions of the side guide 135 come out from between the plurality of protrusions of the upper end engaging part 145.

Figure 19:
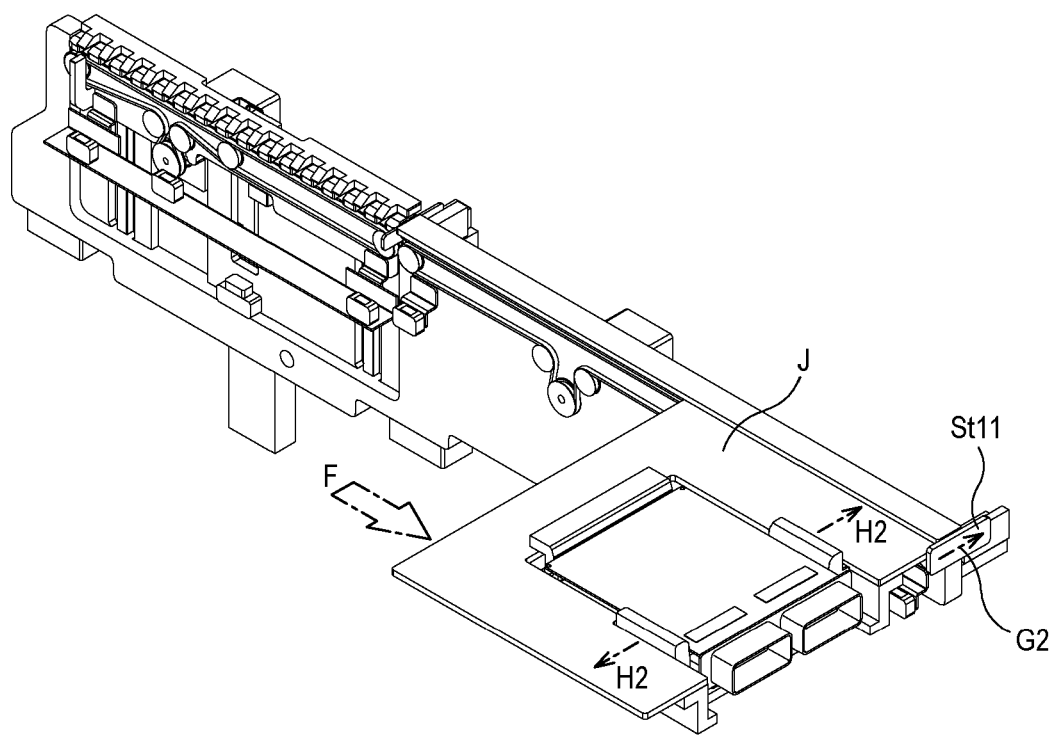
Figure 20:
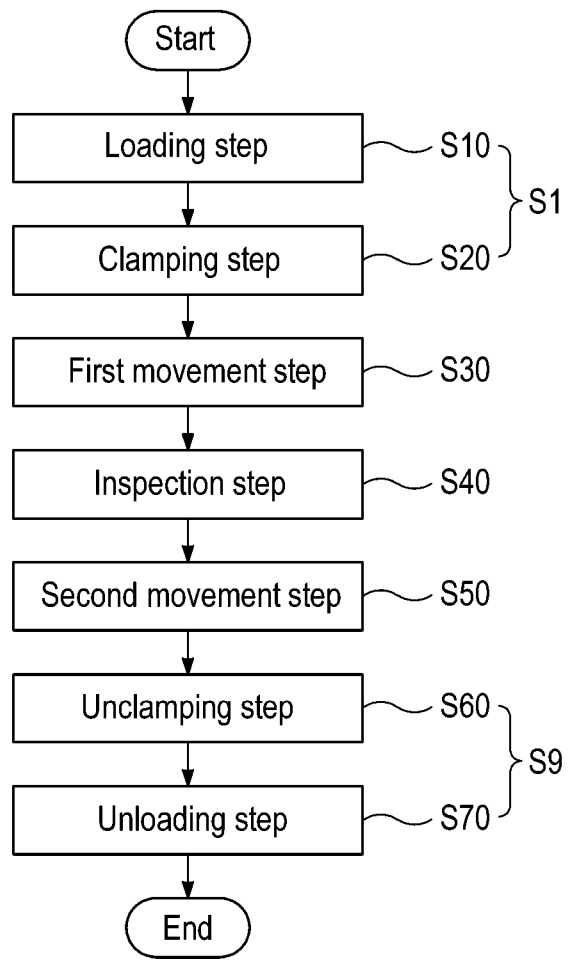
FIG. 20 is a flowchart of a method for inspecting an object according to one embodiment of the present disclosure.

Referring to FIG. 19, the object inspection method includes a forward movement step of moving the jig J in the front direction F. The second movement step S50 may include the forward movement step. The second movement step S50 is performed after the inspection step S40. The object inspection method may further include the downward movement step performed before the second movement step S50. In another embodiment not shown, after the first movement step S30, the inspection step S40 may be performed without the upward movement step, and after the inspection step S40, the second movement step S50 may be performed without the downward movement step.

In the second movement step S50, the jig J may be moved from the support part 131 to the mover 110. In the second movement step S50, the jig J is moved in the front direction and is stopped by the stopper St11.

The object inspection method includes step S9 of unclamping and detaching the object B from the jig J after the second movement step S50. The step S9 includes an unclamping step S60 of moving the damper J10 in the unclamping direction H2 in a state in which the jig J has moved in the front direction. In the unclamping step S60, the object B is unclamped from the jig J. The step S9 includes an unloading step S70 of detaching the object B from the jig J after the unclamping step S60. The unloading step S70 may be performed by an operator or a machine.

Referring to FIG. 20, the object inspection method includes a clamping step S20 of moving the damper J10 in the clamping direction H1 to clamp the object B seated on the jig J to the jig J. The object inspection method may include a loading step S10 performed before the clamping step S20.

The object inspection method includes a first movement step S30 of moving the jig J by the mover 110. In the first movement step S30, the jig J may be moved in the rear direction. The object inspection method may further include the upward movement step performed after the first movement step S30.

The object inspection method includes an inspection step S40 of inspecting the object B to determine whether the object B is defective. The object inspection method includes a second movement step S50 of moving the jig J by the mover 110. In the second movement step S50, the jig J may be moved in the front direction. In the embodiment of the object inspection method including the upward movement step, the downward movement step may be performed after the inspection step S40 and before the second movement step S50.

The object inspection method includes an unclamping step S60 of moving the damper J10 in the unclamping direction H2 to unclamp the object B from the jig J. The object inspection method may include an unloading step S70 performed after the unclamping step S60.

While the foregoing methods have been described with respect to particular embodiments, these methods may also be implemented as computer-readable codes on a computer-readable recording medium. The computer-readable recoding medium includes any kind of data storage devices that can be read by a computer system. Examples of the computer-readable recording medium includes ROM, RAM, CD-ROM, magnetic tape, floppy disk, optical data storage device and the like. Also, the computer-readable recoding medium can be distributed to the computer systems which are connected through a network so that the computer-readable codes can be stored and executed in a distribution manner. Further, the functional programs, codes and code segments for implementing the foregoing embodiments can easily be inferred by programmers in the art to which the present disclosure pertains.

Although the technical spirit of the present disclosure has been described by the examples described in some embodiments and illustrated in the accompanying drawings, it should be noted that various substitutions, modifications, and changes can be made without departing from the scope of the present disclosure which can be understood by those skilled in the art to which the present disclosure pertains. In addition, it should be noted that that such substitutions, modifications and changes are intended to fall within the scope of the appended claims.

What is claimed is:

1. An inspection set, comprising:
a jig configured to allow an inspection object to be seated thereon; and
an inspection apparatus configured to inspect the inspection object, the jig capable of being introduced into and withdrawn from the inspection apparatus, wherein
the jig includes at least one damper configured to be capable of moving in a clamping direction in which the inspection object is clamped to the jig and to be capable of moving in an unclamping direction opposite to the clamping direction,
the inspection apparatus includes:
a mover configured to move the jig; and
at least one clamping driver configured to contact and press the clamper,
the jig includes an elastic member configured to provide an elastic force to press the damper in the clamping direction, and
the clamping driver includes a pressing portion configured to press the damper in the unclamping direction.

2. The inspection set of claim 1, wherein the elastic member is configured to be elastically deformed as the pressing portion presses the damper in the unclamping direction, and
the pressing portion is configured to be spaced apart from the damper as the pressing portion moves in the clamping direction.

3. The inspection set of claim 1, wherein the clamping driver includes a pressing portion configured to press the damper in the unclamping direction, and
the damper includes a driving contact portion having a surface in the clamping direction capable of making contact with the pressing portion.

4. The inspection set of claim 3, wherein the pressing portion and the driving contact portion are configured to face each other in a state in which the jig is located at a predetermined position with respect to the inspection apparatus.

5. The inspection set of claim 1, wherein the at least one damper includes a pair of dampers, and
the at least one clamping driver includes a pair of clamping drivers corresponding to the pair of dampers.

6. The inspection set of claim 1, wherein the jig is configured to be introduced into and withdrawn from the inspection apparatus in a direction perpendicular to the clamping direction.

7. An inspection apparatus configured to inspect an inspection object seated on a jig and inspect whether an insertion of a pin inserted into the inspection object is defective, the jig capable of being introduced into and withdrawn from the inspection apparatus, the inspection apparatus comprising:
a mover configured to move the jig; and
a clamping driver configured to contact and press the jig, the clamping driver including a pressing portion configured to be movable in a clamping direction and an unclamping direction opposite to the clamping direction.

8. The inspection apparatus of claim 7, wherein the mover is configured to move the jig in a direction perpendicular to the clamping direction.

9. The inspection apparatus of claim 7, wherein the mover is configured to move the jig in a front-rear direction in a state in which the jig is capable of slipping.

10. The inspection apparatus of claim 9, wherein the mover includes a transfer belt configured to support the jig and move the jig in a rear direction or in a front direction.

11. The inspection apparatus of claim 9, further comprising a stopper configured to be capable of making contact with a rear end of the jig when the jig is moved in a rear direction by the mover.

12. The inspection apparatus of claim 9, further comprising at least one sensor configured to detect the jig when the jig is located at a predetermined position.

13. The inspection apparatus of claim 7, further comprising:
a pair of transports each having the mover and configured to support left and right end portions of the jig;
a frame guide configured to guide movement of at least one of the transports in a left-right direction; and
a driver configured to provide a driving force to move the at least one of transports in the left-right direction.

14. The inspection apparatus of claim 7, further comprising a sensor configured to detect whether the inspection object is placed.

15. A jig for an inspection apparatus, which is configured to allow an inspection object to be seated thereon, capable of being introduced into and withdrawn from the inspection apparatus for inspecting the inspection object, the jig comprising:
a damper configured to be movable in a clamping direction in which the inspection object is clamped and to be movable in an unclamping direction opposite to the clamping direction; and
a clamping guide configured to guide movement of the damper,
wherein the damper includes:
an object contact portion configured to be capable of making contact with the inspection object; and
a driving contact portion configured to be capable of making contact with the inspection apparatus to receive a driving force to move the clamper and
wherein the jig further comprising an elastic member configured to provide an elastic force to press the damper in the clamping direction.

16. The jig of claim 15, further comprising:
a guide wall configured to be capable of making contact with a side surface of the inspection object; and
a guide pin configured to be inserted into a groove or hole of the inspection object.

* * * * *